(12) United States Patent
Lee et al.

(10) Patent No.: US 7,985,653 B2
(45) Date of Patent: Jul. 26, 2011

(54) SEMICONDUCTOR CHIP WITH COIL ELEMENT OVER PASSIVATION LAYER

(75) Inventors: Wen-Chieh Lee, Hsinchu (TW); Mou-Shiung Lin, Hsinchu (TW); Chien-Kang Chou, Tainan County (TW); Yi-Cheng Liu, Hsinchu (TW); Chiu-Ming Chou, Kaohsiung (TW); Jin-Yuan Lee, Hsinchu (TW)

(73) Assignee: Megica Corporation, Hsinchu (TW)

( * ) Notice: Subject to any disclaimer, the term of this patent is extended or adjusted under 35 U.S.C. 154(b) by 217 days.

(21) Appl. No.: 12/276,419

(22) Filed: Nov. 24, 2008

(65) Prior Publication Data

US 2009/0104769 A1  Apr. 23, 2009

Related U.S. Application Data

(63) Continuation of application No. 11/434,861, filed on May 17, 2006, now Pat. No. 7,470,927.

(60) Provisional application No. 60/682,721, filed on May 18, 2005.

(51) Int. Cl.
*H01L 21/20* (2006.01)
*H01L 21/8222* (2006.01)
*H01L 21/8234* (2006.01)
*H01L 21/4763* (2006.01)
*H01L 21/8238* (2006.01)

(52) U.S. Cl. ........ 438/381; 438/329; 438/238; 438/622; 438/210

(58) Field of Classification Search .................. 438/210, 438/238, 329, 381, 622
See application file for complete search history.

(56) References Cited

U.S. PATENT DOCUMENTS

| 4,021,838 | A | 5/1977 | Warwick |
| 4,051,508 | A | 9/1977 | Sato et al. |
| 4,685,998 | A | 8/1987 | Quinn |
| 5,083,187 | A | 1/1992 | Lamson |
| 5,095,402 | A | 3/1992 | Hernandez |
| 5,226,232 | A | 7/1993 | Boyd |
| 5,310,699 | A | 5/1994 | Chikawa |

(Continued)

FOREIGN PATENT DOCUMENTS

CN  1468442  1/2004

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Luan C Thai
(74) *Attorney, Agent, or Firm* — McDermott Will & Emery LLP

(57) ABSTRACT

A method for fabricating a circuitry component includes providing a semiconductor substrate, a first coil over said semiconductor substrate, a passivation layer over said first coil; and depositing a second coil over said passivation layer and over said first coil. Said second coil may be deposited by forming a first metal layer over said passivation layer, forming a pattern defining layer over said first metal layer, a first opening in said pattern defining layer exposing said first metal layer, forming a second metal layer over said first metal layer exposed by said first opening, removing said pattern defining layer, and removing said first metal layer not under said second metal layer.

29 Claims, 31 Drawing Sheets

U.S. PATENT DOCUMENTS

| | | | |
|---|---|---|---|
| 5,370,766 A | | 12/1994 | Desaigoudar |
| 5,372,967 A | | 12/1994 | Sundaram |
| 5,416,356 A | | 5/1995 | Staudinger |
| 5,468,984 A | | 11/1995 | Efland |
| 5,478,773 A | | 12/1995 | Dow |
| 5,508,561 A | | 4/1996 | Tago |
| 5,532,512 A | | 7/1996 | Fillion |
| 5,534,465 A | | 7/1996 | Frye |
| 5,629,240 A | | 5/1997 | Malladi |
| 5,631,499 A | | 5/1997 | Hosomi |
| 5,659,201 A | | 8/1997 | Wollesen |
| 5,691,248 A | | 11/1997 | Cronin |
| 5,763,108 A | | 6/1998 | Chang |
| 5,789,303 A | | 8/1998 | Leung |
| 5,792,594 A | | 8/1998 | Brown |
| 5,795,818 A | | 8/1998 | Marrs |
| 5,834,844 A | | 11/1998 | Akagawa |
| 5,838,067 A | | 11/1998 | Baek |
| 5,854,513 A | | 12/1998 | Kim |
| 5,883,435 A | | 3/1999 | Geffken |
| 6,002,161 A | * | 12/1999 | Yamazaki .................... 257/531 |
| 6,008,102 A | | 12/1999 | Alford |
| 6,013,571 A | | 1/2000 | Morrell |
| 6,022,792 A | | 2/2000 | Ishii |
| 6,077,726 A | | 6/2000 | Mistry |
| 6,144,100 A | | 11/2000 | Shen |
| 6,177,731 B1 | | 1/2001 | Ishida |
| 6,180,445 B1 | | 1/2001 | Tsai |
| 6,184,143 B1 | | 2/2001 | Ohashi |
| 6,187,680 B1 | | 2/2001 | Costrini |
| 6,229,711 B1 | | 5/2001 | Yoneda |
| 6,236,101 B1 | | 5/2001 | Erdeljac |
| 6,278,264 B1 | | 8/2001 | Burstein |
| 6,303,423 B1 | | 10/2001 | Lin |
| 6,359,328 B1 | | 3/2002 | Dubin |
| 6,362,087 B1 | | 3/2002 | Wang |
| 6,365,498 B1 | | 4/2002 | Chu |
| 6,424,034 B1 | | 7/2002 | Ahn |
| 6,426,281 B1 | | 7/2002 | Lin |
| 6,429,120 B1 | | 8/2002 | Ahn |
| 6,441,715 B1 | | 8/2002 | Johnson |
| 6,459,135 B1 | | 10/2002 | Basteres |
| 6,472,745 B1 | | 10/2002 | Iizuka |
| 6,479,900 B1 | | 11/2002 | Shinogi |
| 6,501,169 B1 | | 12/2002 | Aoki |
| 6,504,227 B1 | * | 1/2003 | Matsuo et al. ................ 257/531 |
| 6,545,354 B1 | * | 4/2003 | Aoki et al. .................... 257/734 |
| 6,559,528 B2 | | 5/2003 | Watase |
| 6,614,091 B1 | | 9/2003 | Downey |
| 6,639,299 B2 | | 10/2003 | Aoki |
| 6,646,347 B2 | | 11/2003 | Mercado |
| 6,683,380 B2 | | 1/2004 | Efland |
| 6,706,554 B2 | | 3/2004 | Ogura |
| 6,707,124 B2 | | 3/2004 | Wachtler et al. |
| 6,707,159 B1 | | 3/2004 | Kumamoto et al. |
| 6,756,664 B2 | | 6/2004 | Yang |
| 6,762,122 B2 | | 7/2004 | Mis |
| 6,780,748 B2 | | 8/2004 | Yamaguchi et al. |
| 6,791,178 B2 | | 9/2004 | Yamaguchi et al. |
| 6,847,066 B2 | | 1/2005 | Tahara et al. |
| 6,852,616 B2 | | 2/2005 | Sahara et al. |
| 6,853,076 B2 | | 2/2005 | Datta et al. |
| 6,869,870 B2 | | 3/2005 | Lin |
| 6,914,331 B2 | | 7/2005 | Shimoishizaka et al. |
| 6,940,169 B2 | | 9/2005 | Jin |
| 6,943,440 B2 | | 9/2005 | Kim |
| 6,963,136 B2 | | 11/2005 | Shinozaki |
| 7,045,899 B2 | | 5/2006 | Yamane |
| 7,078,822 B2 | | 7/2006 | Dias |
| 7,220,657 B2 | | 5/2007 | Ihara et al. |
| 7,239,028 B2 | | 7/2007 | Anzai |
| 7,355,282 B2 | | 4/2008 | Lin |
| 7,423,346 B2 | | 9/2008 | Lin |
| 7,465,654 B2 | | 12/2008 | Chou |
| 7,470,997 B2 | | 12/2008 | Lin |
| 7,531,417 B2 | * | 5/2009 | Lin ............................... 438/381 |
| 2001/0040290 A1 | | 11/2001 | Sakurai |
| 2001/0051426 A1 | | 12/2001 | Pozder et al. |
| 2002/0017730 A1 | | 2/2002 | Tahara |
| 2002/0043723 A1 | | 4/2002 | Shimizu |
| 2002/0158334 A1 | | 10/2002 | Vu |
| 2003/0006062 A1 | | 1/2003 | Stone |
| 2003/0038331 A1 | | 2/2003 | Aoki |
| 2003/0071326 A1 | | 4/2003 | Lin |
| 2003/0102551 A1 | | 6/2003 | Kikuchi |
| 2003/0218246 A1 | | 11/2003 | Abe |
| 2003/0222295 A1 | | 12/2003 | Lin |
| 2003/0224613 A1 | | 12/2003 | Ramanathan |
| 2004/0007779 A1 | | 1/2004 | Arbuthnot |
| 2004/0023450 A1 | | 2/2004 | Katagiri |
| 2004/0094841 A1 | | 5/2004 | Matsuzaki |
| 2005/0092431 A1 | | 5/2005 | Nakamoto et al. |
| 2005/0104158 A1 | | 5/2005 | Bhattacharjee et al. |
| 2006/0049525 A1 | | 3/2006 | Lin |
| 2007/0045855 A1 | | 3/2007 | Lo et al. |
| 2008/0284037 A1 | | 11/2008 | Andry et al. |
| 2009/0108453 A1 | | 4/2009 | Lin |

FOREIGN PATENT DOCUMENTS

| | | |
|---|---|---|
| EP | 1536469 | 6/2005 |
| JP | 10-275811 | 10/1998 |
| JP | 2000-183090 | 6/2000 |
| JP | 2000228420 | 8/2000 |
| JP | 2000228423 | 8/2000 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene" Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No.3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the International IEEE VLSI Multilevel Interconnection Conference (1993) pp. 15-21.

Master, R. et al. "Ceramic Mini-Ball Grid Array Packages for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "Megic way to system solutions through bumping and redistribution," (Brochure) (Feb. 06, 2004) pp. 1-3.

Lin, M.S. "Post Passivation Technology™—MEGIC ® Way to System Solutions," Presentation given at TSMC Technology Symposium, Japan (Oct. 01, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

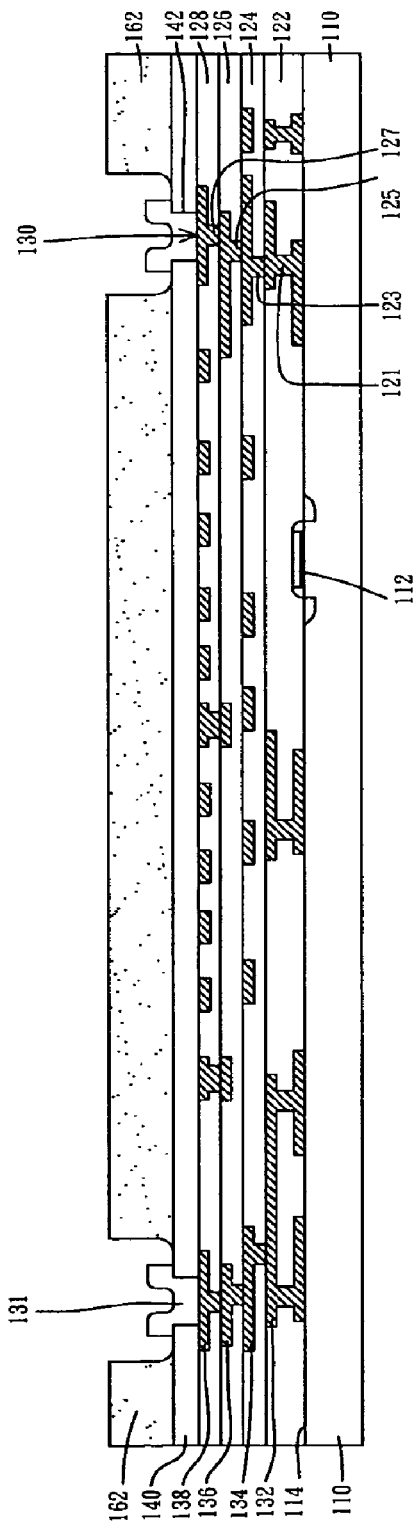
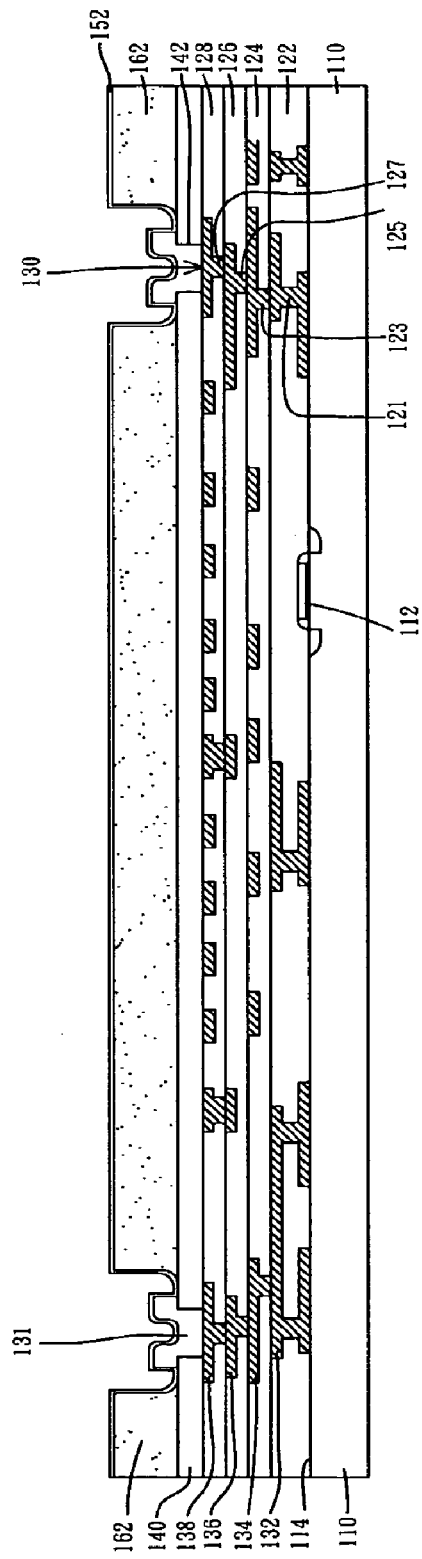
FIG.26
FIG.27

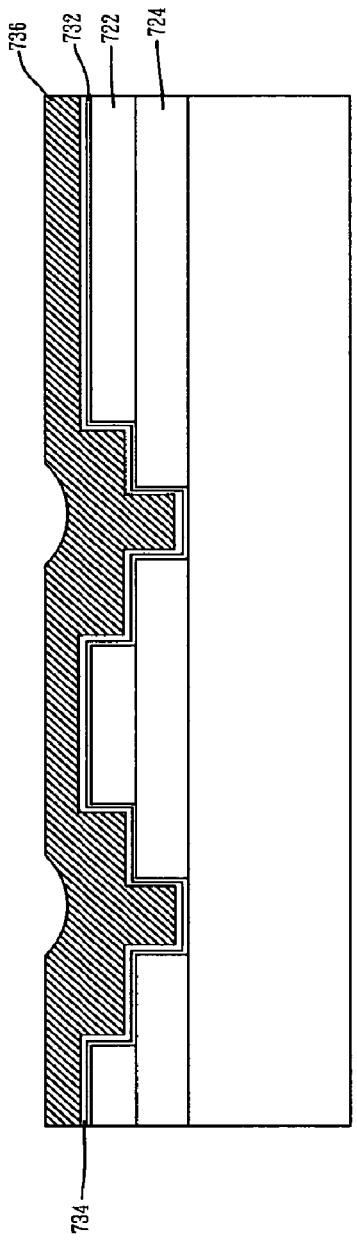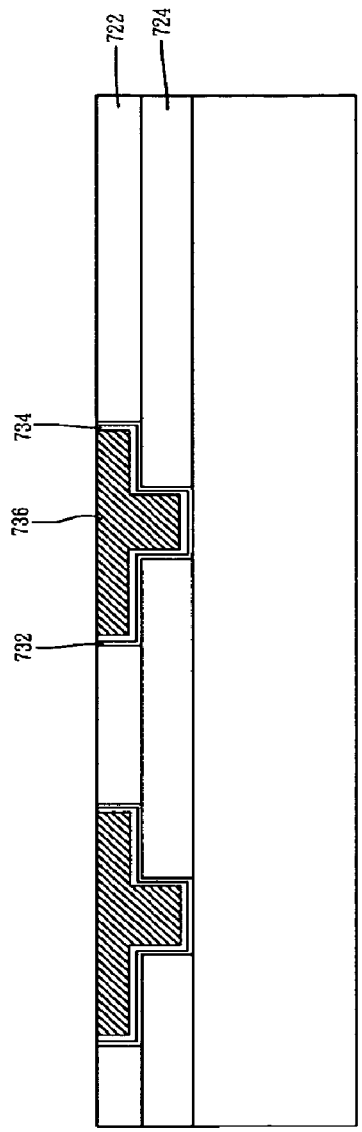
FIG.26 a
FIG.26 b

SEMICONDUCTOR CHIP WITH COIL ELEMENT OVER PASSIVATION LAYER

This application is the continuation of application Ser. No. 11/434,861, filed on May 17, 2006, now U.S. Pat. No. 7,470,927, which claims priority to U.S. provisional application No. 60/682,721, filed on May 18, 2005, which is herein incorporated by reference in its entirety.

FIELD OF THE INVENTION

The invention relates in general to a chip having passive components and a process for forming the same. More particularly, the invention relates to the chip having two coupled induced coils and a process for forming the same.

DESCRIPTION OF THE RELATED ART

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices are aimed at processing digital data. There are also numerous semiconductor designs that are aimed at incorporating analog functions into devices that are capable of processing digital and analog data, or devices that can be used for processing only analog data. One of the major challenges in the creation of analog processing circuitry is that a number of the components used for analog circuitry are large in size and are therefore not readily integrated into sub-micron devices. Especially, these components may be passive devices, whose size is much huge in comparison with the size of normal semiconductor devices.

U.S. Pat. No. 5,212,403 (Nakanishi) discloses a method of forming wiring connections both inside and outside in a wiring substrate over the chip for a logic depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/O traces.

U.S. Pat. No. 6,008,102 (Alford et al.) shows a helix inductor using two metal layers connected by vias.

U.S. Pat. No. 5,372,967 (Sudaram et al.) discloses a helix inductor.

U.S. Pat. No. 5,576,680 (Ling) and U.S. Pat. No. 5,884,990 (Burghartz et al.) show other helix inductor designs.

U.S. Pat. No. 6,383,916 discloses a chip structure comprising a redistribution lines layer and a metal lines layer deposited on a dielectric layer, wherein the dielectric layer is located over a passivation layer of a traditional chip. The passivation layer is located onto an integrated circuit and a thick polymer layer is deposed optionally onto the passivation layer. The layers of wide or thick metal lines are located on the passivation layer.

U.S. Pat. No. 6,303,423 discloses a chip structure comprising an inductor having a high inductance deposed on the passivation layer. The inductor having a high inductance can be applied in a high frequency circuit and can reduce power consumption. This patent discloses also capacitors and resistors formed on the surface of the silicon substrate to decline the parasitic capacitance incurred by electronic devices in the underlying silicon substrate.

U.S. Pat. No. 6,869,870 (Lin) discloses a transformer formed over a passivation layer of a chip.

SUMMARY OF THE INVENTION

An objective of the prevent invention is to provide a circuitry component comprising two mutual induced coils and a process for forming the same.

In order to reach the above objectives, the present invention provides a method for fabricating a circuitry component includes providing a semiconductor substrate, a first coil over said semiconductor substrate, a passivation layer over said first coil; and depositing a second coil over said passivation layer and over said first coil. Said second coil may be deposited by forming a first metal layer over said passivation layer, forming a pattern defining layer over said first metal layer, a first opening in said pattern defining layer exposing said first metal layer, forming a second metal layer over said first metal layer exposed by said first opening, removing said pattern defining layer, and removing said first metal layer not under said second metal layer.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

FIGS. 26-35 are cross-sectional views showing a process for forming a top coil over a semiconductor wafer.

FIGS. 26a and 26b are cross-sectional views showing a metal damascene process, wherein a bottom coil can be formed using the metal damascene process.

DESCRIPTION OF THE PREFERRED EMBODIMENTS

Figure 1A:
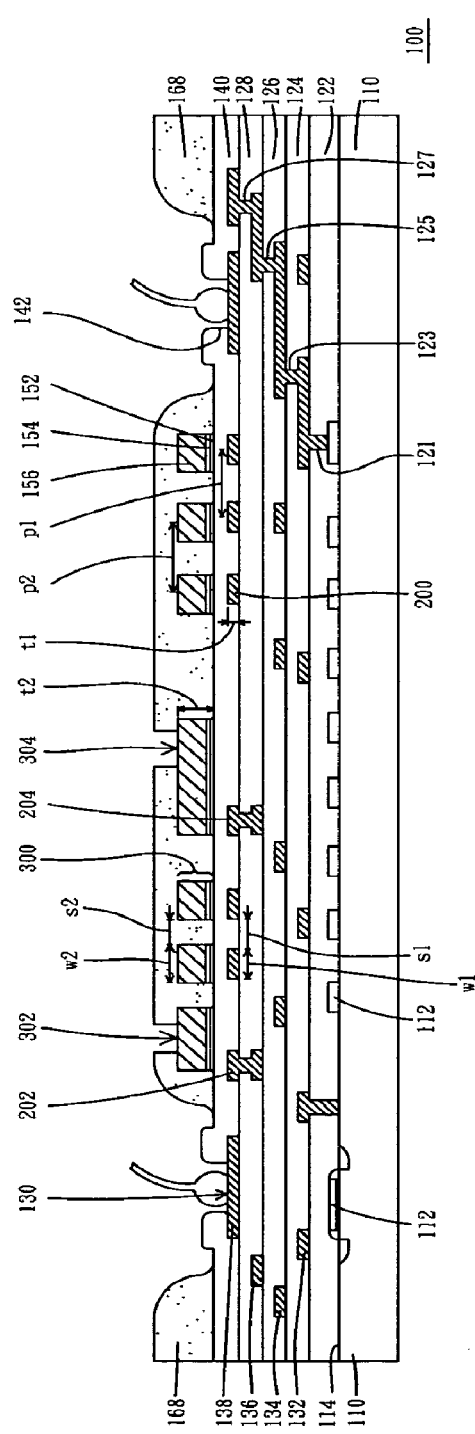
FIG. 1a is a cross-sectional view showing a semiconductor chip with a coil on a passivation layer according to the present invention.

FIG. 1a is a cross-sectional view showing a semiconductor chip according to a first embodiment of the present invention. A semiconductor chip 100 comprises a semiconductor substrate 110, multiple thin-film isolating layers 122, 124, 126 and 128, multiple thin-film circuit layers 132, 134, 136, 138, a passivation layer 140, a thick circuit layer and a polymer layer 168. Multiple electronic devices 112 are formed in or on the semiconductor substrate 110, wherein the semiconductor substrate 110 can be, for example, a silicon substrate, a germanium arsenide substrate or a silicon-on-insulator (SOI) substrate. In addition, the SOI substrate includes a silicon substrate for the purpose of a support, an insolating layer, for example, made of silicon dioxide and an epitaxial silicon layer, wherein the insolating layer of silicon dioxide is formed on the silicon substrate, and the epitaxial silicon layer is formed on the insolating layer of silicon dioxide.

The multiple electronic devices 112 can be formed by doping ions with pendat valence or trivalence, such as phosphorus ions or boron ions, into the surface layer of the semiconductor substrate 110. These electronic devices include, for instance, metal oxide semiconductor (MOS) devices and transistors, such as p-channel MOS devices, n-channel MOS devices, BiCMOS devices, Complementary MOS (CMOS) devices, Bipolar Junction Transistor (BJT), or include diffusion area, or passive devices, such as resistor or capacitor.

By using a CVD (chemical vapor deposition) process, multiple thin-film isolating layers 122, 124, 126, 128 can be formed on an active surface 114 of the semiconductor substrate 110. The material of the thin-film isolating layers 122, 124, 126, 128 can be, for instance, CVD silicon oxide, CVD tetraethylorthosilicate (TEOS) oxide, silicon nitride or silicon oxynitride, spin-on glass (SOG), fluorinated silica glass (FSG), SiLK, black diamond, polyarylene, ether, polybenzoxazole, porous silicon oxide and spin-on dielectrics with a $Si_wC_xO_yH_z$ composition or high density plasma enhanced chemical vapor deposition (HDPECVD) oxide. Alternatively, each of the thin-film isolating layers 122, 124, 126 and 128 can be a composite layer or single layer of at least one of the above-mentioned materials. The material of thin-film isolating layers 122, 124, 126 and 128 may be the material with a low dielectric constant (k<3) or a super low dielectric constant (k<2.2). Multiple thin-film circuit layers 132, 134, 136 and 138 are formed on the thin-film isolating layers 122, 124, 126 and 128, respectively. Multiple thin-film circuit layers 132, 134, 136 and 138 include, for example, sputtered aluminum or aluminum alloy, or electroplated copper. A bottom surface and a side wall of the electroplated copper can be covered by an adhesion/barrier layer made of, for example, Tantalum (Ta), Tantalum nitride (TaN), Titanium (Ti), Titanium nitride (TiN). This kind of structure is also called as a metal damascene structure. In the metal damascene process, the adhesion/barrier layer is first sputtered or deposited by using a chemical vapor deposition (CVD) process on the bottom and side wall of openings in a thin-film isolating layer and on the top surface of the thin-film isolating layer. Then, a seed layer, such as copper, is sputtered on the adhesion/barrier layer. Next, a copper layer is electroplated on the seed layer. Then, the electroplated copper layer, the seed layer and the adhesion/barrier layer outside the openings in the thin-film isolating layer are removed by using a Chemical Mechanical Polishing (CMP) until the top surface of the thin-film isolating layer is exposed, wherein the material of the isolating layer can be, for example, silicon oxide, material with a dielectric constant between 2 and 4 or material containing flourine.

Alternatively, during forming multiple thin-film circuit layers 132, 134, 136 and 138, an aluminum layer or aluminum-alloy layer can be first sputtered on a thin-film isolating layer. Then, the aluminum layer or aluminum alloy layer is patterned by using a photolithography process and an etching process. In one case, all of the thin-film circuit layers 132, 134, 136 and 138 can be, for example, made of sputtered aluminum or aluminum alloy. In another case, all of the thin-film circuit layers 132, 134, 136 and 138 can be, for instance, formed by the above mentioned metal Damascene process. In another case, the thin-film circuit layers 132, 134 and 136 can be, for example, formed by the above mentioned metal damascene process and only the topmost thin-film circuit layer 138 is made of sputtered aluminum or aluminum alloy. The thin-film circuit layers 132, 134, 136 and 138 can be connected with each other through the via holes 121, 123, 125 and 127 in the thin-film isolating layers 122, 124, 126 and 128, or connected to the electronic devices 112.

In general, each of the thin-film circuit layers 132, 134, 136 and 138 has a thickness of, for example, between 0.1 micron and 3 micrometers. During the photolithography process, the thin-film circuit layer can be formed using 5× steppers or scanners or better equipments and the thickness of a coated photoresist layer, in general, is less than 5 micrometers.

The topmost thin-film circuit layer 138 has certain areas defined as electrical contact points 130 used to be connected to some components, such as wirebonded wires, gold bumps, tin-lead bumps or Tape-Automated-Bonded (TAB) component. The largest traverse dimension of the electrical contact points 130 can be reduced to from 5 micrometers to 40 micrometers. Preferably, it can be reduced to from 20 micrometers to 35 micrometers, so that the parasitic capacitance created between the electrical contact points 130 and the underlying metal traces can decline. These electrical contact points 130 can be electrically connected to the transistors on or in the surface layer of the semiconductor substrate 110 or other electronic devices 112. Through these electrical contact points 130, the thin-film circuit layers 132, 134, 136 and 138 can be electrically connected to external circuits.

Reference number 140 indicates a passivation layer above the thin-film circuit layers 132, 134, 136 and 138, which can protect electronic devices 112 from the damage of moisture and foreign ion contamination. The mobile ions (such as sodium ion), transition metals (such as gold, silver, copper) and other impurities, can be prevented from penetrating through the passivation layer 140, so the damage of the electronic devices 112 or the thin circuits of transistors, poly silicon resistors or poly-poly capacitors can be avoided. To reach the goal of the protection, the passivation layer 140 is usually made of silicon oxide, silicon nitride or silicon oxynitride.

In a first case, the passivation layer 140 can be formed by first depositing a silicon-oxide layer with a thickness of between 0.2 and 1.2 micrometers using a PECVD process, then depositing a silicon-nitride layer with a thickness of between 0.2 and 1.2 micrometers on the silicon-oxide layer using a PECVD process.

In another case, the passivation layer 140 can be formed by first depositing a silicon-oxide layer with a thickness of between 0.2 and 1.2 micrometers using a PECVD process, then depositing a silicon-oxynitride layer with a thickness of between 0.05 and 0.15 micrometers on the silicon-oxide layer using a PECVD process, and then depositing a silicon-nitride layer with a thickness of between 0.2 and 1.2 micrometers on the silicon-oxynitride layer using a PECVD process.

In another case, the passivation layer 140 can be formed by first depositing a silicon-oxynitride layer with a thickness of between 0.05 and 0.15 micrometers using a PECVD process, then depositing a silicon-oxide layer with a thickness of between 0.2 and 1.2 micrometers on the silicon-oxynitride layer using a PECVD process, and then depositing a silicon-nitride layer with a thickness of between 0.2 and 1.2 micrometers on the silicon-oxide layer using a PECVD process.

In another case, the passivation layer 140 can be formed by first depositing a first silicon-oxide layer with a thickness of between 0.2 and 0.5 micrometers using a PECVD process, then depositing a second silicon-oxide layer with a thickness of between 0.5 and 1 micron on the first silicon-oxide layer using a spin-coating process, then depositing a third silicon-oxide layer with a thickness of between 0.2 and 0.5 micrometers on the second silicon-oxide layer using a PECVD process, and then depositing a silicon-nitride layer with a thickness of between 0.2 and 1.2 micrometers on the third silicon-oxide layer using a PECVD process.

In another case, the passivation layer 140 can be formed by first depositing a silicon-oxide layer with a thickness of between 0.5 and 2 micrometers using a HDP-CVD process, and then depositing a silicon-nitride layer with a thickness of between 0.2 and 1.2 micrometers on the silicon-oxide layer using a PECVD process.

In another case, the passivation layer 140 can be formed by first depositing an undoped silicate glass (USG) layer with a thickness of between 0.2 and 3 micrometers, then depositing a layer of tetraethylorthosilicate (TEOS), borophosphosilicate glass (BPSG) or phosphosilicate glass (PSG) with a thickness of between 0.5 and 3 micrometers on the USG layer, and then depositing a silicon-nitride layer with a thickness of between 0.2 and 1.2 micrometers on the layer of TEOS, BPSG or PSG using a PECVD process.

In another case, the passivation layer 140 can be formed by optionally first depositing a first silicon-oxynitride layer with a thickness of between 0.05 and 0.15 micrometers using a PECVD process, then depositing a silicon-oxide layer with a thickness of between 0.2 and 1.2 micrometers optionally on the first silicon-oxynitride layer using a PECVD process, then optionally depositing a second silicon-oxynitride layer with a thickness of between 0.05 and 0.15 micrometers on the silicon-oxide layer using a PECVD process, then depositing a silicon-nitride layer with a thickness of between 0.2 and 1.2 micrometers on the second silicon-oxynitride layer or on the silicon-oxide layer using a PECVD process, then optionally depositing a third silicon-oxynitride layer with a thickness of between 0.05 and 0.15 micrometers on the silicon-nitride layer using a PECVD process, and then depositing a silicon-oxide layer with a thickness of between 0.2 and 1.2 micrometers on the third silicon-oxynitride layer or on the silicon-nitride layer using a PECVD process.

In another case, the passivation layer 140 can be formed by first depositing a first silicon-oxide layer with a thickness of between 0.2 and 1.2 micrometers using a PECVD process, then depositing a second silicon-oxide layer with a thickness of between 0.5 and 1 micrometers on the first silicon-oxide layer using a spin-coating process, then depositing a third silicon-oxide layer with a thickness of between 0.2 and 1.2 micrometers on the second silicon-oxide layer using a PECVD process, then depositing a silicon-nitride layer with a thickness of between 0.2 and 1.2 micrometers on the third silicon-oxide layer using a PECVD process, and then depositing a fourth silicon-oxide layer with a thickness of between 0.2 and 1.2 micrometers on the silicon-nitride layer using a PECVD process.

In another case, the passivation layer 140 can be formed by first depositing a silicon-oxide layer with a thickness of between 0.5 and 2 micrometers using a HDP-CVD process, then depositing a silicon-nitride layer with a thickness of between 0.2 and 1.2 micrometers on the silicon-oxide layer using a PECVD process, and then depositing another silicon-oxide layer with a thickness of between 0.5 and 2 micrometers on the silicon-nitride layer using a HDP-CVD process.

In general, the thickness of the passivation layer 140 is larger than 0.35 micrometer. Preferably, the thickness of a layer of silicon nitride is usually larger than 0.3 micrometer. Openings 142 in the passivation layer 140 expose the contact points 130 of the topmost thin-film circuit layer 138. The largest traverse dimension of the openings 142 in the passivation layer 140 ranges, for example, from 0.1 micron and 20 micrometers. In the present invention, the largest traverse dimension of openings 142 in the passivation layer 140 can be reduced to 0.1 micron. Therefore, the area of the electric contact points 130 can be very small. As a result, the routing ability of the topmost thin-film circuit layer 138 can be enhanced.

Figure 1C:
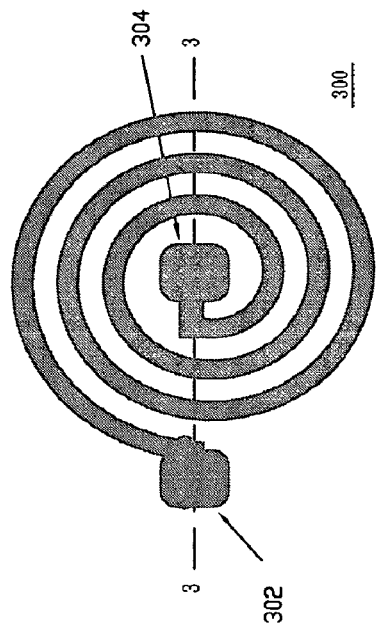
FIG. 1c is a top view showing a top coil of the present invention.
Figure 1B:
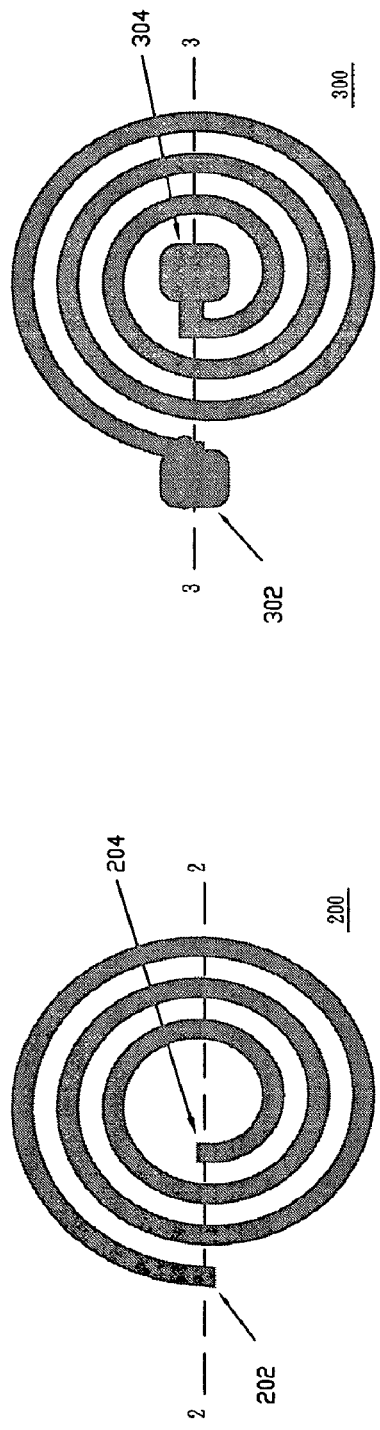
FIG. 1b is a top view showing a bottom coil of the present invention.

The topmost thin-film circuit layer 138 below the passivation layer 140 comprises a bottom coil 200. FIG. 1b is a top view of the bottom coil 200. The cross-sectional view of the bottom coil 200 is shown in FIG. 1a, which is made along the cross-sectional line 2-2 cut in the bottom coil 200 shown in FIG. 1b. Two contact points 202 and 204 of the bottom coil 200 can be connected to the electronic devices 112 through the thin-film circuit layers 136, 134 and 132, or to an external circuit through the electrical contact points 130 exposed by the openings 142 in the passivation layer 140. A pitch p1 between the centers of the neighboring turns of the bottom coil 200 ranges, for example, from 0.1 micrometer to 500 micrometers, and preferably from 1 micron to 20 micrometers. The material of the bottom coil 200 and the process of forming the same can be referred to the above mentioned material of the topmost thin-film circuit layer 138 and the process for forming the same. The bottom coil 200 has a turn having a thickness t1 ranging from 0.3 micrometer to 5 micrometers. The bottom coil 200 has a turn having a width w1 ranging, for instance, from 0.05 to 500 micrometers, and preferably from 0.5 to 20 micrometers. A space s1 between the neighboring turns of the bottom coil 200 ranges, for example, from 0.1 micrometer to 500 micrometers, and preferably from 1 micron to 20 micrometers.

Figure 1D:
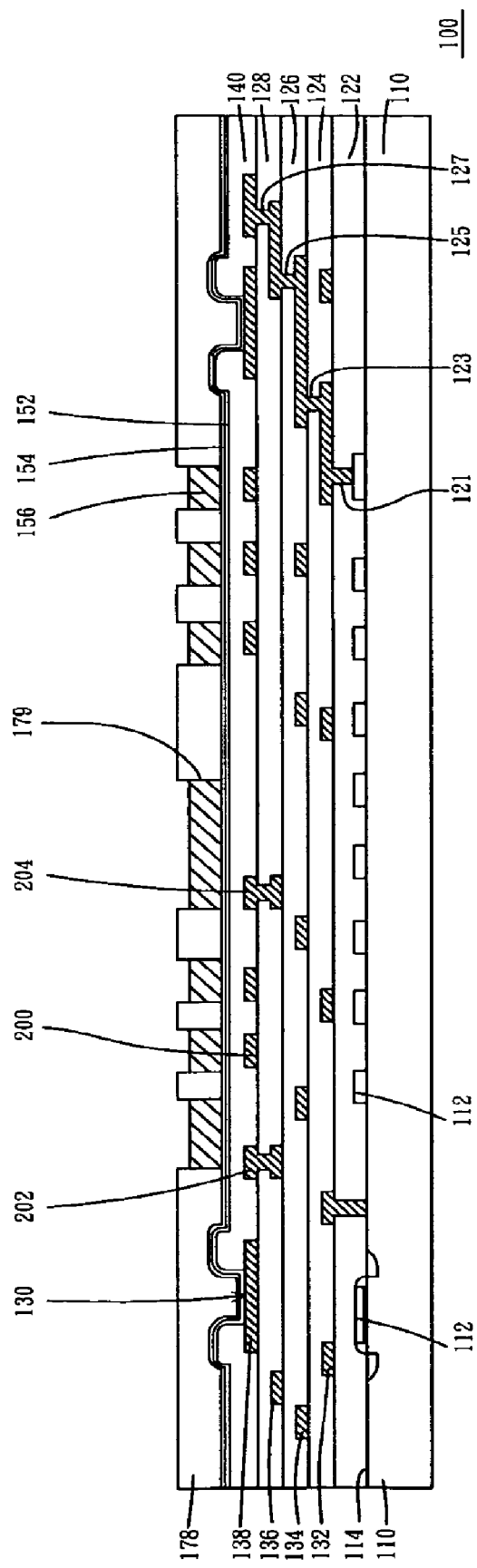
FIG. 1d is a cross-sectional view showing a process for fabricating a top coil over a semiconductor wafer.

A thick metal circuit layer is formed on the passivation layer 140, as shown in FIG. 1d. A process for forming the thick metal circuit layer is described as follows. First, an adhesion/barrier layer 152, such as titanium or a titanium-tungsten alloy, is formed on the passivation layer 140 and on the electrical contact points 130 by a sputtering or evaporating process, wherein the thickness of the adhesion/barrier layer 152 ranges from 0.1 and 1 micron. Next, a seed layer 154, such as gold, is formed onto the adhesion/barrier layer 152 by a sputtering, evaporating or electroless plating process, wherein the thickness of the seed layer ranges from 0.05 to 1 micron. Next, a photoresist layer 178 is formed onto the seed layer 154 by using a spin-on-coating process. Then, multiple patterned openings 179 in the photoresist layer 178 can be formed by using exposing and developing processes to expose the seed layer 154. Next, a thick metal layer, such as gold, is formed onto the seed layer 154 exposed by the patterned openings 179 in the photoresist layer 178 by an electroplating process, wherein the thickness of the thick metal layer 156 ranges from 1 micron to 30 micrometers, and preferably from 1 to 15 micrometers. Subsequently, referring to the FIG. 1a, the photoresist layer 178 is removed. Next, the seed layer 154 not under the thick metal layer 156 is removed by an etching process. Next, the adhesion/barrier layer 152 not under the thick metal layer 156 is removed by an etching process.

In another case, a thick metal circuit layer can be also formed by another process, as shown in FIG. 1d. A process for forming the thick metal circuit layer is described as follows. First, an adhesion/barrier layer 152, such as titanium, an titanium-tungsten alloy, chromium or a chromium-copper alloy, is formed on the passivation layer 140 and on the electrical contact points 130 by a sputtering or evaporating process, wherein the thickness of the adhesion/barrier layer 152 ranges from 0.1 to 1 micron. Next, a seed layer 154, such as copper, is formed on the adhesion/barrier layer 152 by a sputtering, evaporating or electroless plating process, wherein the thickness of the seed layer ranges from 0.05 to 1 micron. Next, a photoresist layer 178 is formed on the seed layer 154 by using a spin-on-coating process. Next, multiple patterned openings 179 in the photoresist layer 178 can be formed by using exposing and developing processes. to expose the seed layer 154. Next, a thick metal layer, such as copper, is formed on the seed layer 154 exposed by the patterned openings 179 in the photoresist layer 178 by an electroplating process, wherein the thickness of the thick metal layer 156 ranges from 1 micron to 30 micrometers, and preferably ranges from 1 micron to 15 micrometers. Next, a nickel layer (not shown) is optionally formed on the thick metal layer 156 exposed by the patterned openings 179 in the photoresist layer 178 by an electroplating process, wherein the thickness of the nickel layer ranges from 1 to 10 micrometers. Next, a gold layer is optionally formed on the thick metal layer 156 or the nickel layer exposed by the patterned openings 179 in the photoresist layer 178 by an electroplating process, wherein the thickness of the gold layer ranges from 0.1 to 10 micrometers. Next, referring to the FIG. 1a, the photoresist layer 178 is removed. Next, the seed layer 154 not under the thick metal layer 156 is removed by an etching process. Next, the adhesion/barrier layer 152 not under the thick metal layer 156 is removed by an etching process.

The thick metal circuit layer over the passivation layer 140 comprises a top coil 300. FIG. 1c is a top view of the top coil 300. The cross-sectional view of the top coil 300 is shown in FIG. 1a, which is made along the cross-sectional line 3-3 cut in the top coil 300 shown in FIG. 1c. The top coil 300 comprises two electrical contact points 302 and 304 used to be connected to some components, such as wirebonded wires, gold bumps, tin-lead bumps or a Tape-Automated-Bonded (TAB) component. The top coil 300 can be electrically connected to an external circuit through two electrical contact points 302 and 304. A pitch p2 between the centers of the neighboring turns of the top coil 300 ranges, for example, from 3 micrometers to 500 micrometers, and preferably from 3 micron to 20 micrometers. The material of the top coil 300 and the process of forming the same can be referred to the above mentioned material of the thick metal circuit layer and the process for forming the same. The top coil 300 has a turn having a thickness t2 ranging, for example, from 1 micron to 30 micrometers, and preferably from 3 micrometers to 10 micrometers. The top coil 300 has a turn having a width w2 ranging, for instance, from 1 to 500 micrometers and preferably from 2 to 20 micrometers. A space s2 between the neighboring turns of the top coil 300 ranges, for example, from 1 micron to 500 micrometers, and preferably from 2 micrometers to 20 micrometers.

A polymer layer 168, such as polyimide or benzo-cyclobutene (BCB), can be formed on the passivation layer 140 and on the top coil 300 by using a spin-on-coating process. Then, multiple openings 168 are formed in the polymer layer 168 using a 1× stepper and through exposing and developing processes to expose the contact points 130, 302 and 304. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 168 at the temperature of between 250 centigrade degrees and 450 centigrade degrees lasting for more than 30 minutes. The thickness of the polymer layer 168 after being curred ranges from 5 micrometers to 20 micrometers.

In the present invention, between two coils 200 and 300, the passivation layer 140 can prevent the two coils 200 and 300 from ohmic contact. In other words, the passivation layer 140 sustains the coupling effect between the two coils 200 and 300. The top coil 300 and the bottom coil 200 formed using the above mentioned processes can make a transformer or a coupler.

Figure 2:
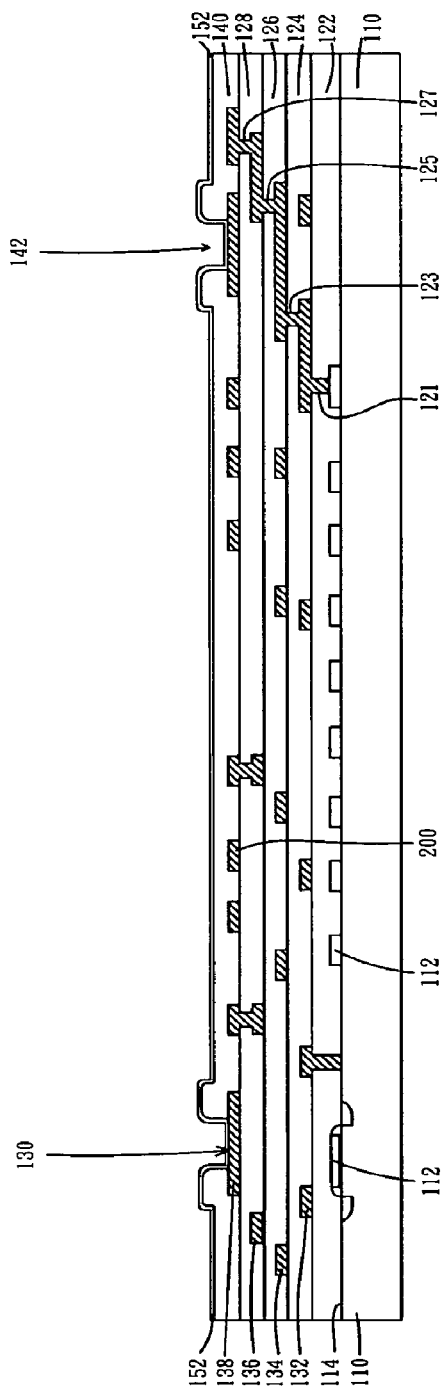
FIGS. 2-8 are cross-sectional views showing a process for forming a top coil over a semiconductor wafer.

FIGS. 2-8 are cross-sectional views showing a process of forming a metal trace or a coil on the passivation layer 140 of the semiconductor wafer by using an embossing process. Referring to FIG. 2, by using a sputtering process, an adhesion/barrier layer 152 is formed on the passivation layer 140 of the semiconductor wafer and on the electric contact points 130 exposed by the openings 142 in the passivation layer 140. The thickness of the adhesion/barrier layer 152 ranges about from 0.1 micrometer to 1 micron. The material of the adhesion/barrier layer 152 can be titanium, tungsten (W), cobalt (Co), nickel (Ni), titanium nitride (TiN), a titanium tungsten alloy (TiW), vanadium (V), chromium (Cr), copper (Cu), a chromium copper alloy (CrCu), tantalum (Ta), tantalum nitride (TaN) or a composite layer or single layer of at least one of the above mentioned materials. Alternatively, the adhesion/barrier layer 152 can be formed by using an electroless plating process, a CVD process, or an evaporating process. The adhesion/barrier layer 152 improves the bonding ability of a following deposited metal and the semiconductor wafer and prevents the following deposited metal form diffusing into the contact points 130. When copper is used as the following deposited metal, it is quite important to choose the material for forming the adhesion/barrier layer 152. Although copper is cost competitive and has low resistance, the diffusion coefficient of copper for silicon oxide and silicon is quite great. If copper diffuses into the silicon oxide, the dielectric material becomes conductive and the dielectric performance or isolating performance thereof declines. Therefore, using copper as the following deposited metal, it is necessary to form at least an adhesion/barrier layer to prevent copper form diffusing into a silicon oxide layer in the passivation layer 140. Although a silicon nitride layer in the passivation layer 140 can prevent copper from diffusion, it is not suitable that a patterned circuit layers is formed on the silicon nitride layer, referring to the prior art. It is because, compared with silicon oxide, silicon nitride has a larger dielectric constant and therefore, the parasitic capacitance caused between the patterned circuit layer on the passivation layer 140 and the thin-film circuit layer under the passivation layer 140 becomes larger.

Figure 3:
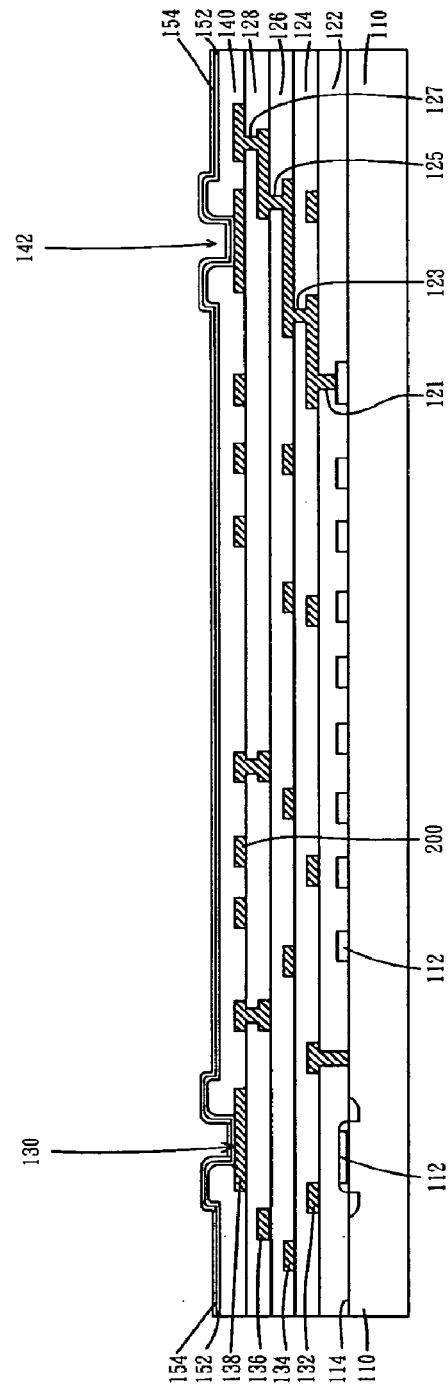

After forming the adhesion/barrier layer 152, a seed layer 154 can be formed on the adhesion/barrier layer 152 by using a sputtering process, an evaporating process or an electroless plating process. As shown in FIG. 3, the thickness of the seed layer 154 ranges about from 0.05 micrometer to 1 micron. The seed layer 154 can be formed in a sputter chamber or an ion Metal Plasma chamber at the temperature of between 0 and 300 centigrade degrees and in the pressure of between 1 and 100 mTorr. Using copper or a copper alloy as a target, argon gas is introduced and its flow is controlled between 10 and 400 sccm.

Figure 4:
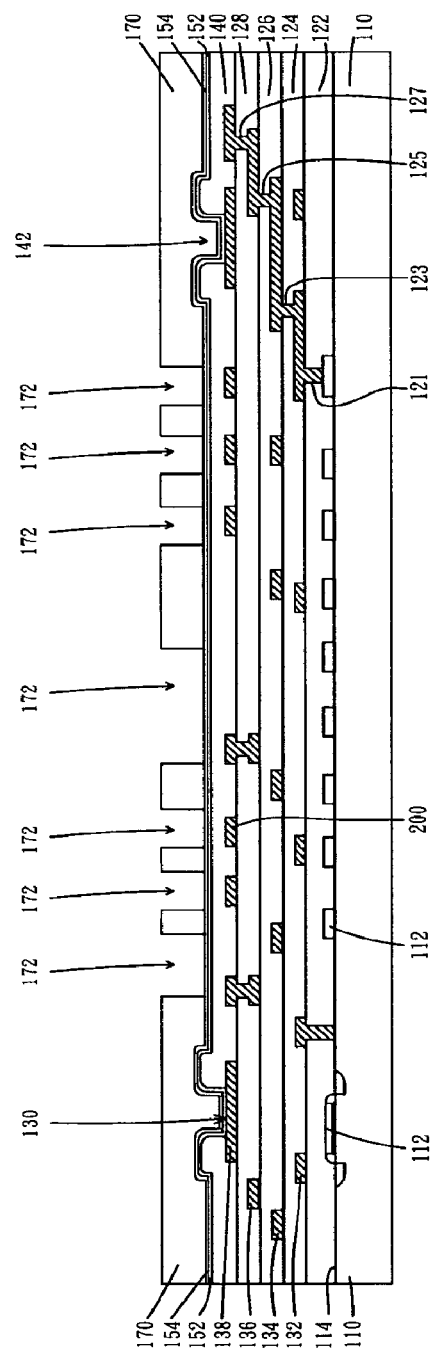

Next, referring to FIG. 4, a photoresist layer 170 is formed on the seed layer 154 by using a spin-on coating process. Then, multiple openings 172 are formed in the photoresist layer 170 by using a 1× stepper and through exposing and developing processes to expose the seed layer 154. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. The thickness of the photoresist layer 170 ranges, for instance, from 2 micrometers to 100 micrometers and preferably from 8 micrometers to 30 micrometers. The photoresist layer 170 may be positive photoresist, such as napthoquinone diazide derivative.

Figure 5:
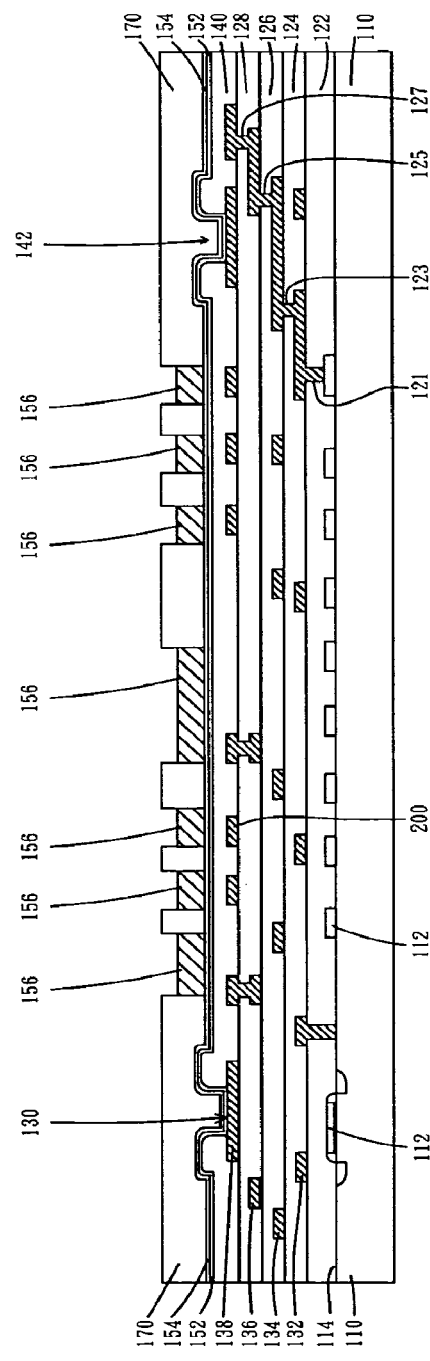

Then, as shown in FIG. 5, a thick metal layer 156 is formed on the seed layer 154 exposed by openings 172 in the photoresist layer 170 by using an electroplating or an electroless plating process, wherein using an electroplating process is preferable. The metal layer 156 may include gold (Au), silver (Ag), copper (Cu), nickel (Ni), palladium (Pd), platinum (Pt), rhodium (Ru), ruthenium (Re), a tin-lead alloy, a tin-silver alloy, or a composite layer or single layer of at least one of the above mentioned materials. When a copper layer of the thick metal layer 156 is electroplated on the seed layer 154, copper is preferable as the material of the seed layer 154. When a gold layer of the thick metal layer 156 is electroplated on the seed layer 154, gold is preferable as the material of the seed layer 154. When a silver layer of the thick metal layer 156 is electroplated on the seed layer 154, silver is preferable as the material of the seed layer 154. When a palladium layer of the thick metal layer 156 is electroplated on the seed layer 154, palladium is preferable as the material of the seed layer 154. When a platinum layer of the thick metal layer 156 is electroplated on the seed layer 154, platinum is preferable as the material of the seed layer 154. When a rhodium layer of the thick metal layer 156 is electroplated on the seed layer 154, rhodium is preferable as the material of the seed layer 154. When a ruthenium layer of the thick metal layer 156 is electroplated on the seed layer 154, ruthenium is preferable as the material of the seed layer 154. When a nickel layer of the thick metal layer 156 is electroplated on the seed layer 154, nickelel is preferable as the material of the seed layer 154. The purpose of forming the seed layer 154 is to enhance the performance of electroplating the thick metal layer 156. The thickness of the metal layer 156 ranges about from 0.1 micrometer to 30 micrometers, and preferably from 2 to 15 micrometers.

If the electroplated thick metal layer 156 is gold, the thickness of the thick metal layer 156 ranges, for example, from 1 micron to 30 micrometers, and preferably from 1 micron to 15 micrometers. If the electroplated thick metal layer 156 is copper, the thickness of the thick metal layer 156 ranges, for example, from 1 micron to 30 micrometers. Alternatively, the thick metal layer 156 can be deposited by electroplating multiplemetal layers. For example, the thick metal layer 156 can be deposited by first electroplating a copper layer with a thickness of between 1 micron and 30 micrometers on the seed layer 154 exposed by the openings 172 in the photoresist layer 170, next electroplating a nickel layer with a thickness of between 0.5 and 10 micrometers on the copper layer exposed by the openings 172 in the photoresist layer 170, and next electroplating a gold layer with a thickness of between 0.5 and 15 micrometers on the nickel layer exposed by the openings 172 in the photoresist layer 170.

An electrolyte for electroplating gold may contain sulphurous acid, sodium ion and gold ion, wherein The concentration of the gold ion in the electrolyte ranges, for example, from 5 gram per liter to 20 gram per liter. The temperature of the electrolyte is controlled, for example, between 30 centigrade degrees and 65 centigrade degrees. The PH value of the electrolyte lies, for example, between 6.5 and 9. The current density for electroplating gold lies, for example, between 1 microampere per square centimeter and 10 microampere per square centimeter. Alternatively, another electrolyte for electroplating gold may contain, for example, cyanide and potassium ion.

Figure 6:
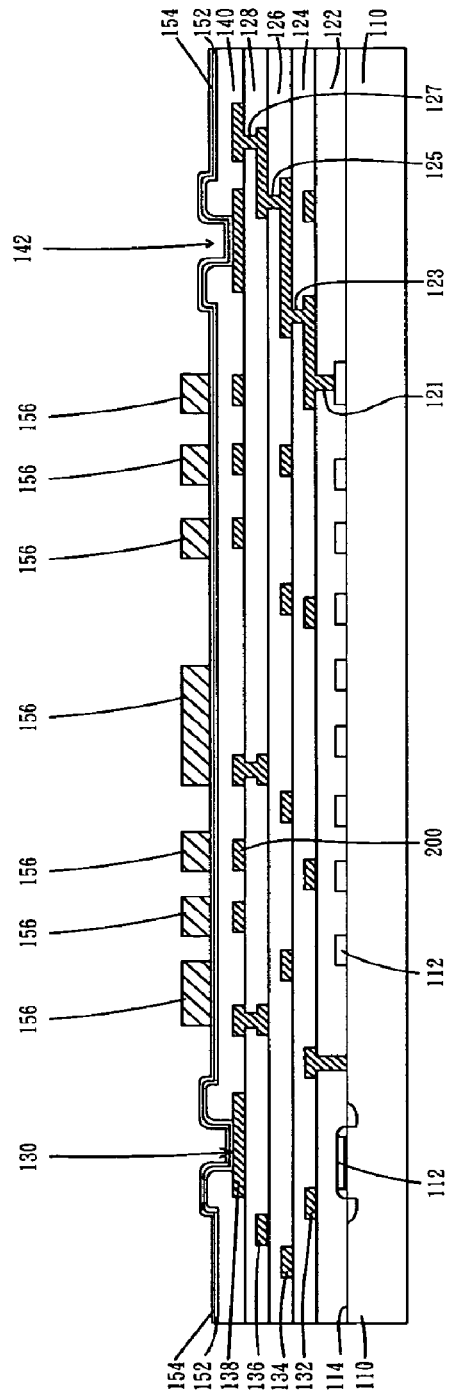
Figure 7:
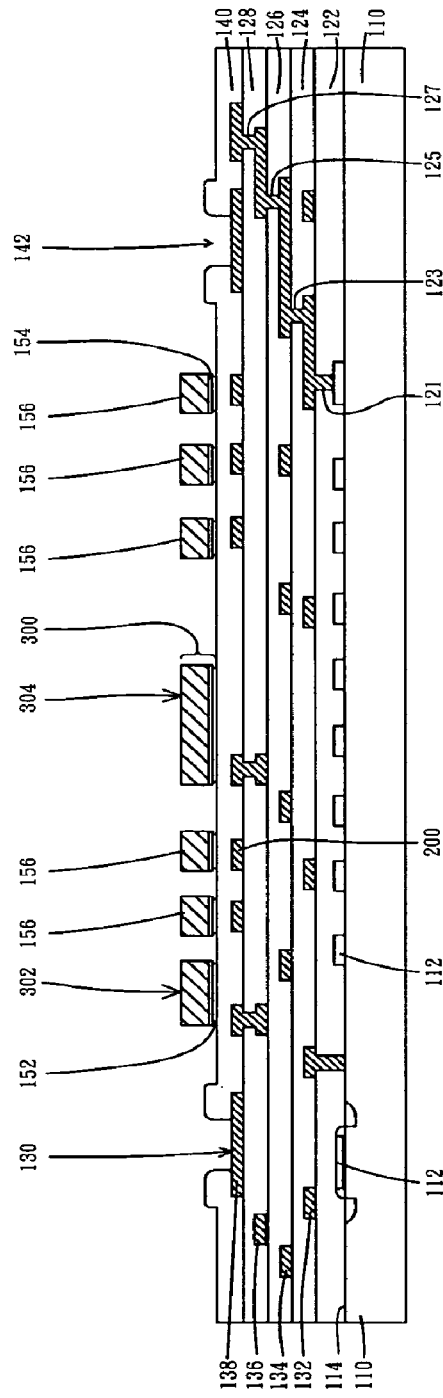

After forming the thick metal layer 156, the photoresist layer 170 is removed, as shown in FIG. 6. Then, the thick metal layer 156 acting as an etching mask, the seed layer 154 and the adhesion/barrier layer 152 not covered by the thick metal layer 156 are removed by a self-aligned wet etching process. Only the seed layer 154 and the adhesion/barrier layer 152 under the thick metal layer 156 are left. An undercut is formed around the adhesion/barrier layer 152 and inwardly and laterally extends under the seed layer 154, as shown in FIG. 7, wherein the lateral depth of the undercut ranges, for example, from 0.03 micrometer to 2 micrometers and depends on the etching factors and over-etch time. If gold is formed for the seed layer 154, an etchant containing Iod can be used to etch the seed layer 154. If a titanium-tungsten alloy is formed for the adhesion/barrier layer 152, an etchant containing hydrogen peroxide can be used to etch the adhesion/barrier layer 152.

Figure 8:
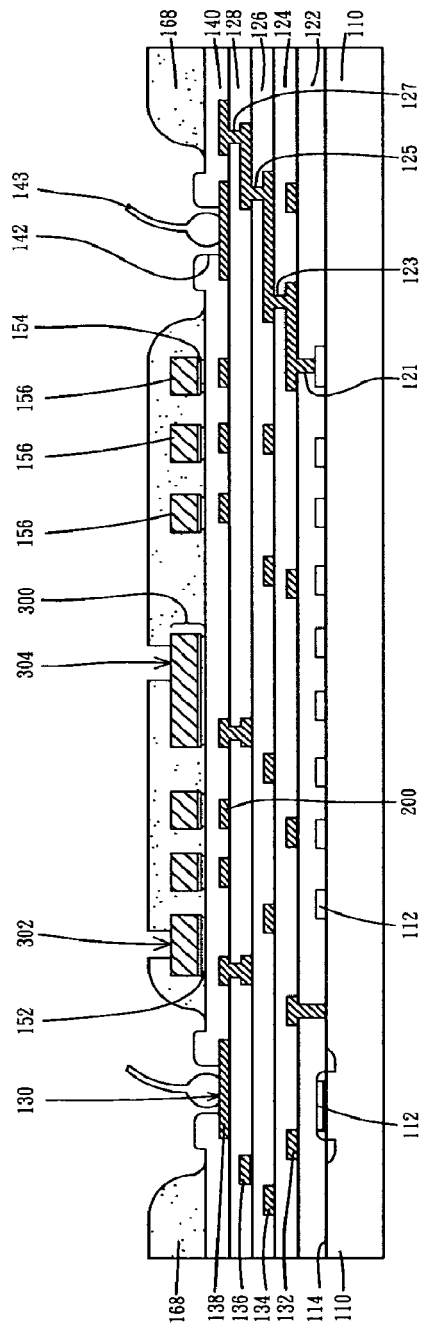

Referring to FIG. 8, next, a polymer layer 168 is formed on the thick circuit 300 and the passivation layer 140, wherein multiple openings 167 in the polymer layer 168 expose multiple contact points 302, 304 of the thick circuit 300. The polymer layer 168 is made of, for example, polyimide or benzo-cyclobutene (BCB) and the thickness of the polymer layer 168 after being curred ranges from 5 micrometers to 20 micrometers. Openings in the polymer layer 168 expose the electric contact points 302 and 304 of the top coil 300 and the electric contact points 130 exposed by the openings 142 in the passivation layer 140.

The main function of the polymer layer 168 covering the circuit 300 is to prevent the circuit 300 from being polluted or damaged. If the circuit 300 is made of gold, it may be not necessary to form the polymer layer 168 on the circuit 300, because gold is noble metal. In other words, forming the top polymer layer depends on the request of chip manufacturing process and design. This idea can be introduced in all cases of the present invention.

Between the seed layer 154 and the thick metal layer 156 is a clear interface, which can be observed by Transmission Electron microscope (TEM). The interface is caused by the difference of grain size and grain orientation between the seed layer 154 and the thick metal layer 156. For instance, a sputtered seed layer 154 made of gold with a thickness of 1000 Angstroms is located under a thick, electroplated metal layer made of gold with a thickness of 4 micrometers. The gain size of the seed layer 154 is about 1000 Angstroms and the grain boundary is perpendicular to the surface of the semiconductor substrate. The grain size of the thick metal layer 156 is more than 2 micrometers and the grain boundary is not perpendicular to the surface of the semiconductor substrate but has the included angle between the grain boundary and the surface of the semiconductor substrate is about 45 degrees.

Referring to FIG. 1a, contact points 302, 304 of the thick metal layer 300 can be connected through wirebonded wires, bumps, or TAB substrate to an external circuit, such as a glass substrate, a printed circuit board (PCB), a ceramic substrate or a flexible substrate, with a patterned circuit layer. The above mentioned metal deposition process can reduce the waste of materials, especially for noble metals, such as gold, silver or palladium (Pd).

Because of the protection provided by the passivation layer 140, it is allowed to choose a cheaper process for forming patterned circuit layers above the passivation layer 140 and to employ a clean room with a lower class of cleanliness, such as class 100 or higher one. The definition of Class 100 is that the number of particles whose size is larger than 0.5 micrometer exceeds 100 per cubic foot. A detailed definition is shown as follows.

Quality of air in a clean room is defined as class number according to the size and density of airborne particles. In 1963, the class number is defined in the U.S. federal standard No. 209. After many alterations, the latest standard No. 209E is as shown in the following table. The table shows different kinds of class numbers specified by the allowable particle size and number per cubic foot of air.

According to the table, It is clear that different classes are specified by particle size and number. For example, during forming thin metal traces of the thin-film circuit layers 132, 134, 136 and 138 under the passivation layer 140, the required standard of a cleanroom, in general, is less than or the same as the class 10. The definition of class 10 is that the number of the particles whose size is bigger than 0.1 micrometer does not exceed 350, the number of the particles whose size is bigger than 0.2 micrometer does not exceed 75, the number of the particles whose size is bigger than 0.3 micrometer does not exceed 30, the number of the particles whose size is bigger than 0.5 micrometer does not exceed 10, and the particles whose size is bigger than 5 micrometers does not exit. The following table shows the relationship between the class number of a cleanroom and allowable maximum particle number of the specified particle size.

| | Particle/ft$^3$ | | | | |
| --- | --- | --- | --- | --- | --- |
| Class | 0.1 micron | 0.2 micron | 0.3 micron | 0.5 micron | 5 micron |
| 1 | $3.50 \times 10$ | 7.70 | 4.00 | 1.00 | |
| 10 | $3.50 \times 10^2$ | $7.50 \times 10$ | $3.00 \times 10$ | $1.00 \times 10$ | |
| 100 | | $7.50 \times 10^2$ | $3.00 \times 10^2$ | $1.00 \times 10^2$ | |
| 1,000 | | | | $1.00 \times 10^3$ | 7.00 |
| 10,000 | | | | $1.00 \times 10^4$ | $7.00 \times 10$ |
| 100,000 | | | | $1.00 \times 10^5$ | $7.00 \times 10^2$ |

While 1× steppers or scanners are used in the photolithography process for forming the circuit over the passivation layer 140, 5× steppers, scanners or better equipments are needed in the photolithography process forming the thin-film circuit under the passivation layer 140. Moreover, the thin-film circuit under the passivation layer 140, in general, is formed in a cleanroom of class 10 or less than 10. Therefore, the cost for forming the circuit over the passivation layer 140 is less than that for forming the circuit under the passivation layer 140. In the photolithography process for forming the circuit over the passivation layer 140, a photoresist layer with a thickness of more than 5 micrometers is usually used; however, in the photolithography process for forming the thin-film circuit under the passivation layer 140, a photoresist layer with a thickness of less than 5 micrometers is usually employed.

Figure 9:
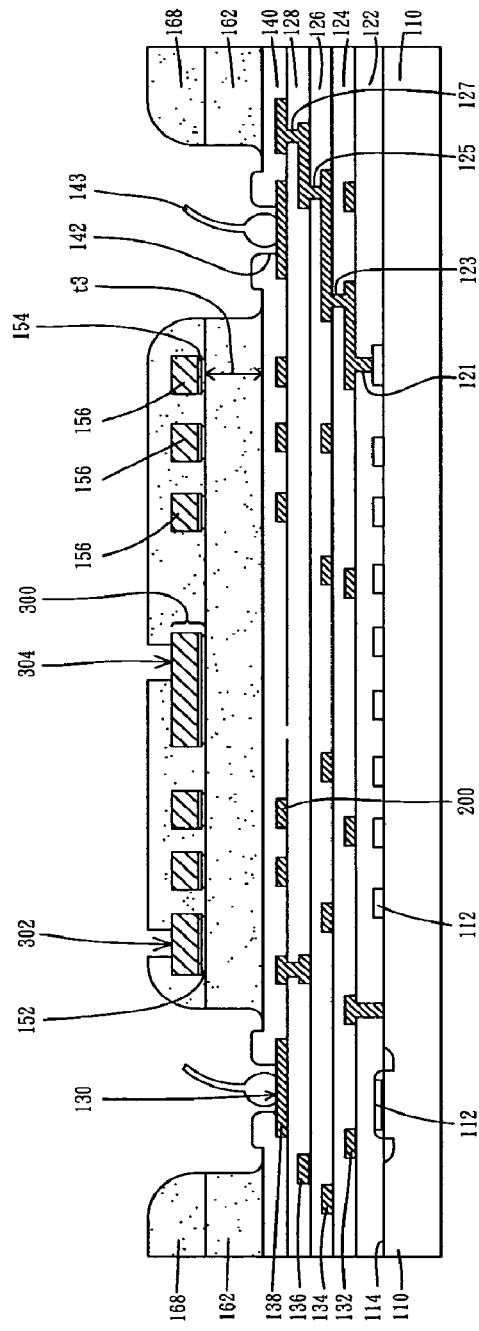
FIGS. 9-11 are cross-sectional views showing a semiconductor chip with a coil over a passivation layer according to the present invention, wherein the coil is over a polymer layer.

In another case, as shown in FIG. 9, a polymer layer 162 is first formed on the passivation layer 140 by using a spin-on coating process. Then, multiple openings are formed in the polymer layer 162 by using 1× steppers and through exposing and developing processes to expose the electrical contact points 130 exposed by the openings 142 in the passivation layer 140. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 168 at the temperature of between 250 centigrade degrees and 450 centigrade degrees, lasting for more than 30 minutes. Next, a top coil 300 is formed on the polymer layer 162 by using the above mentioned processes without ion milling the polymer 162 before forming the top coil 300, and, therefore, the surface of the polymer layer 162 can not be damaged due to the ion milling process. the polymer layer 162 can be, for example, polyimide or benzo-cyclobutene (BCB). The polymer layer 162 after being cured has a thickness t3 of between 5 and 20 micrometers.

Figure 10:
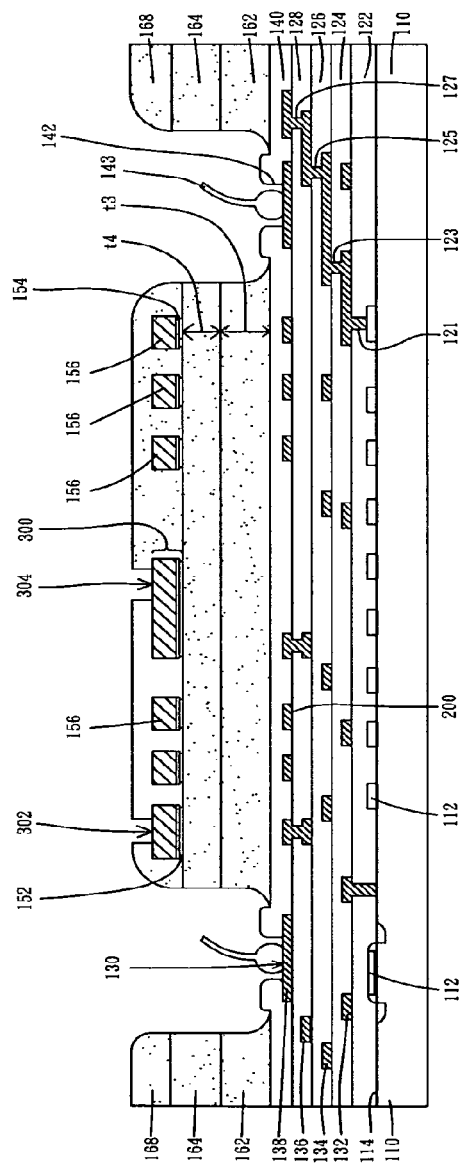

In another case, as shown in FIG. 10, a polymer layer 162 is first formed on the passivation layer 140 by using a spin-on coating process. Then, multiple openings are formed in the polymer layer 162 by using 1× steppers and through exposing and developing processes to expose the electrical contact points 130 exposed by the openings 142 in the passivation layer 140. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 162 at the temperature of between 250 centigrade degrees and 450 centigrade degrees, lasting for more than 30 minutes. Then, a polymer layer 164 is formed on the polymer layer 162 by using a spin-on coating process. Then, multiple openings are formed in the polymer layer 164 by using 1× steppers and through exposing and developing processes to expose the electrical contact points 130 exposed by the openings 142 in the passivation layer 140. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 164 at the temperature of between 250 centigrade degrees and 450 centigrade degrees, lasting for more than 30 minutes. Next, a top coil 300 is formed on the polymer layer 164 by using the above mentioned processes without ion milling the polymer 164 before forming the top coil 300, and, therefore, the surface of the polymer layer 164 can not be damaged due to the ion milling process. The polymer layers 162 and 164 can be, for example, polyimide or benzo-cyclobutene (BCB). The polymer layers 162 and 164 after being cured may have thicknesses t3 and t4 of between 5 and 20 micrometers, respectively. As above mentioned, multiple polymer layers 162 and 164 can be formed between the top coil 300 and the bottom coil 200 to increase a distance between these two coils 300 and 200.

Figure 11:
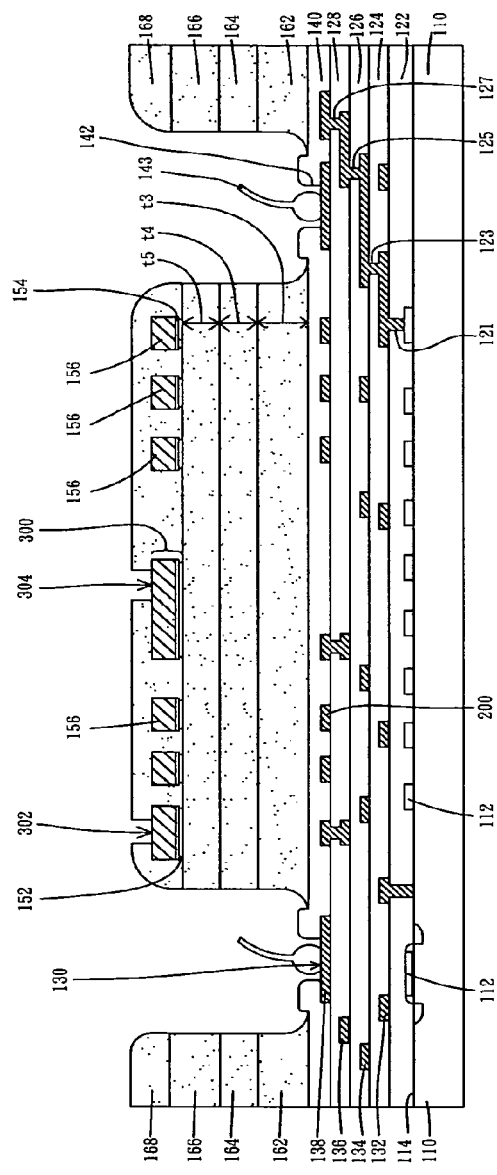

In addition, after forming the polymer layer 164 shown in FIG. 10, a polymer layer 166 can be formed on the polymer layer 164 by using a spin-on coating process, as shown in FIG. 11. Then, multiple openings are formed in the polymer layer 166 by using 1× steppers and through exposing and developing processes to expose the electrical contact points 130 exposed by the openings 142 in the passivation layer 140. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 166 at the temperature of between 250 centigrade degrees and 450 centigrade degrees, lasting for more than 30 minutes. Next, a top coil 300 is formed on the polymer layer 166 by using the above mentioned processes without ion milling the polymer 166 before forming the top coil 300, and, therefore, the surface of the polymer layer 166 can not be damaged due to the ion milling process. The polymer layers 162, 164 and 166 can be, for example, polyimide or benzo-cyclobutene (BCB). The polymer layers 162, 164 and 166 after being cured may have thicknesses t3, t4 and t5 of between 5 and 20 micrometers, respectively. As above mentioned, multiple polymer layers 162, 164 and 166 can be formed between the top coil 300 and the bottom coil 200 to increase a distance between these two coils 300 and 200.

Alternatively, the polymer layer 162, 164, 166 and 168 can be parylene, porous dielectric material, elastomer, Ester, Teflon, Silicone or an epoxy-based material, such as photosensitive epoxyresin.

Any one of the polymer layers 162, 164, 166 and 168 are from 2 to 500 times thicker than any one of the thin-film isolating layers 122, 124, 126 and 128 or any one of the thin-film circuit layers 132, 134, 136 and 138. If the polymer layers 162, 164, 166 and 168 are made of Polyimide, the polymer layers 162, 164, 166 and 168 can be cured at the temperature of between 250 centigrade degrees and 450 centigrade degrees for from 3 hours to 5 hours in vacuum or nitrogen ambient. Alternatively, a polymer layer between the top coil 300 and the bottom coil 200 can be formed by using a screen printing process. The polymer layer formed by screen printing can be, for instance, between 10 micrometers and 100 micrometers. Alternatively, a quite thick polymer dry film can be formed on the passivation layer 140 by using a laminating process, and then can be patterned by using a photolithography process. The polymer layer formed by a laminating process may have a thickness of, for example, between 10 micrometers and 500 micrometers. After depositing the polymer layer formed by screen printing or laminating, a top coil 300 can be formed on the polymer layer using the above mentioned processes.

In this case, the distance between the bottom coil 200 and the top coil 300 lies, for instance, between 0.5 micrometer and 100 micrometers, and preferably between 3 micrometers and 50 micrometers. A polymer layer may be deposited between the bottom coil 200 and the top coil 300, wherein the thickness of the polymer layer lies, for example, between 5 micrometers and 50 micrometers.

Referring to FIGS. 8-11, a conducting wire 143 is formed, for instance, by using wirebonding process to be connected with the electrical contact points 130. The semiconductor chip shown in FIGS. 8-11 can be connected through the conductive wire 143 to an external circuit, such as another semiconductor chip, a printed circuit board (PCB), a ceramic substrate or a glass substrate.

In the present invention, the distance between the top coil 300 and the bottom coil 200 of a transformer or a coupler can be adjusted according to an electric request. The perpendicular distance between the top coil 300 and the bottom coil 200 lies, for example, between 0.1 micrometer and 500 micrometers, and preferably between 0.5 micrometer and 20 micrometers.

Figure 12:
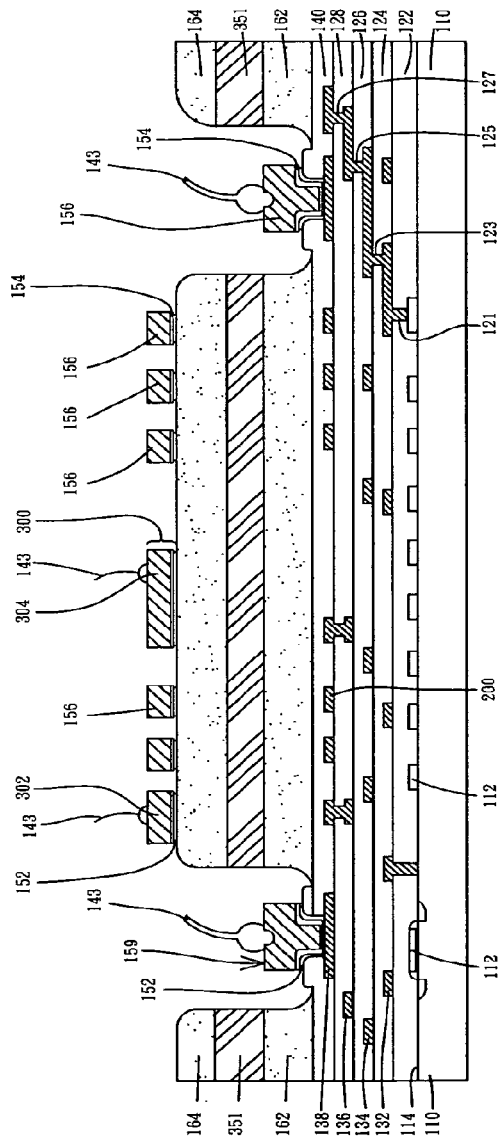
FIG. 12 is a cross-sectional view showing a semiconductor chip with a coil over a passivation layer according to the present invention, wherein there is a magnetic material between a top coil and a bottom coil.

FIG. 12 is a schematical cross-sectional view showing a magnetic material between the top coil 300 and the bottom coil 200. The transformer or coupler of the present invention is composed of the top coil 300 and the bottom coil 200. To enhance the mutual inductance, or in other words, to avoid a bad transformation between the top coil 300 and the bottom coil 200, a magnetic layer 351 can be disposed between the top coil 300 and the bottom coil 200. Because the magnetic layer 351 is closer to the top coil 300 than to the bottom coil 200, signals descended from the top coil 300 are effectively absorbed by the magnetic layer 351 and are effectively passed to the bottom coil 200. Therefore, the magnetic layer 351 prevents signals originated from the top coil 300 from being transmitted to the bottom coil 200. Materials of the magnetic layer 351 include, for example, Fe, Co, Ni, Rh, Al, Ca, Cr, Mn, Nb, Pt, W, or an alloy of the above mentioned materials, wherein a ferromagnet is more suitable. The distance between the magnetic layer 351 and the top coil 300 depends on the thickness of the polymer layer 164 ranging from 5 to 20 micrometers, for example. The distance between the magnetic layer 351 and the bottom coil 200 depends on the thickness of the polymer layer 162 and the thickness of the passivation layer 140, wherein the thickness of the polymer layer 162 lies, for example, between 5 and 20 micrometers. The thickness t6 of the magnetic layer 351 lies, for instance, 0.1 and 5 micrometers. The structures and materials of the polymer layer 162 and 164 and the passivation layer 140 can be referred to as those having the same reference number in the above description.

Figure 13:
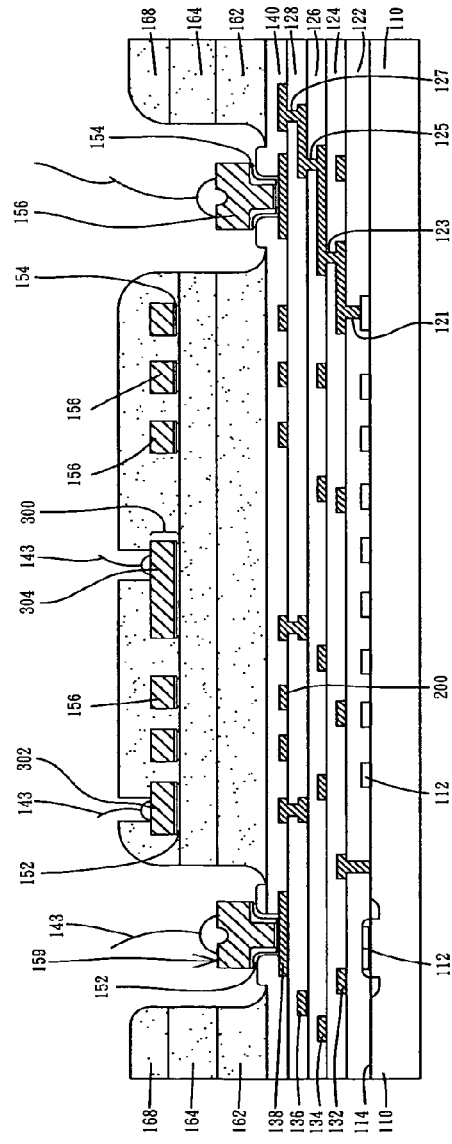
FIGS. 13-16 are cross-sectional views showing a semiconductor chip with a coil over a passivation layer according to the present invention, wherein a top coil is connected to an external circuitry using various ways.

FIGS. 12-16 are schematic cross-sectional view showing a semiconductor chip with electric contact points 130 exposed by openings in the passivation layer, connected to an external circuit through multiple ways mentioned as follows. FIG. 12 and FIG. 13 show multiple wirebonding pads 159 located on electric contact points 130 exposed by openings 142 in the passivation layer 140, wherein multiple conducting wires are formed on the wirebonding pads 159 by a wirebonding process for connecting the semiconductor chip to an external circuit, such as a printed circuit board (PCB) or another semiconductor chip. The process of forming the wirebonding pads 159 is the same as that of forming the top coil 300. First, an adhesion/barrier layer 152 of the previous mentioned material and thickness is formed on the polymer layer 164 and on the electric contact points 130 exposed by the openings 142 in the passivation layer 140. Next, a seed layer 154 of the previous mentioned material and thickness is formed on the adhesion/barrier layer 152. Then, a photoresist layer is formed on the seed layer 154. Openings in the photoresist layer with the pattern of the top coil 300 and wirebonding pads 159 expose the seed layer 154, wherein the opening with the pattern of the top coil 300 exposes the seed layer 154 on the polymer layer 164 and the openings with the pattern of the wirebonding pads 159 expose the seed layer 154 on contact points 130. Next, a thick metal layer 156 of the previous mentioned material and thickness is formed on the seed layer 154 exposed by the openings in the photoresist layer. Then, the photoresist layer is removed. Subsequently, the seed layer 154 not under the thick metal layer 156 is removed. Next, the adhesion/barrier layer 152 not under the thick metal layer 156 is removed.

The contact points 302 and 304 of the top coil 300 are connected with, for example, conducting wires 143 formed by a wirebonding process, or gold bumps or solder bumps formed by an electroplating process, so that the top coil 300 can be electrically connected to an external circuit, such as a printed circuit board (PCB), a ceramic substrate or a glass substrate or another semiconductor chip. Through conducting wires 143 formed by a wirebonding process, wirebonding pads 159 can be electrically connected to an external circuit, such as a printed circuit board (PCB), a ceramic substrate or a glass substrate or another semiconductor chip. Before the top coil 300 and the wirebonding pads 159 are connected to an external circuit, a testing probe can be connected to the contact points 302 and 304 of the top coil 300 and the wirebonding pads 159 for electrical testing.

In FIG. 12, the top coil 300 is exposed to the ambient and is not covered by a polymer layer. Preferably, the top surface of the thick metal layer 156 is composed of a noble metal, such as gold, platinum or palladium. In FIG. 13, the polymer layer 168 is formed on the top coil 300 and openings in the polymer layer 168 expose the contact points 302 and 304 of the top coil 300.

Figure 14:
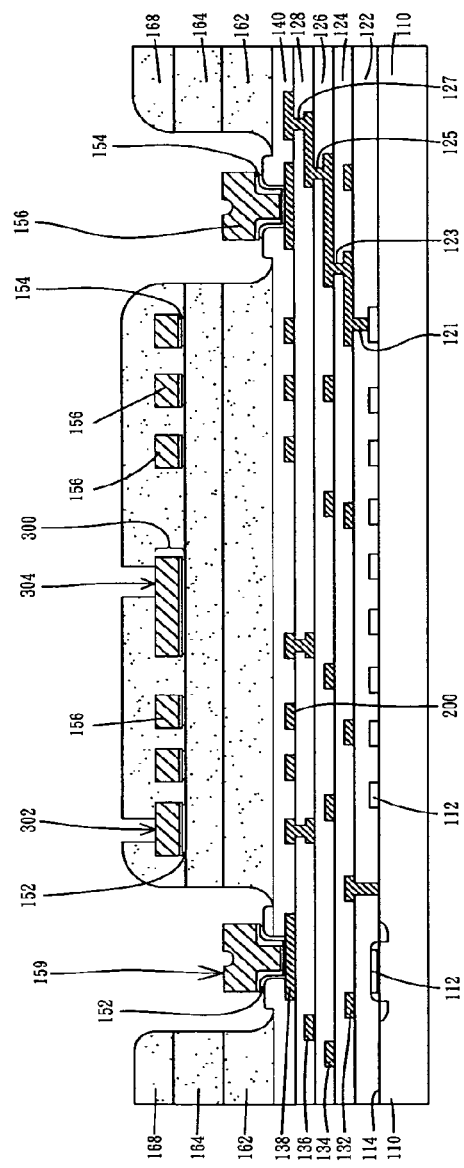

In FIG. 14, the metal pads 159 and the contact points 302 and 304 of the top coil 300 exposed by openings in the polymer layer 168 are used for electrical testing. No wirebonded wires or bumps are formed on the metal pads 159 and the contact points 302 and 304 of the top coil 300. Other contact points of the top coil 300 not shown in FIG. 14 may be connected with conducting wires formed by a wirebonding process or gold bumps or solder bumps formed by electroplating process, so that the top coil 300 can be electrically connected to an external circuit. Metal pads formed on the contact points exposed by the openings in the passivation layer can be connected to an external circuit through conducting wires formed by a wirebonding process.

Figure 15:
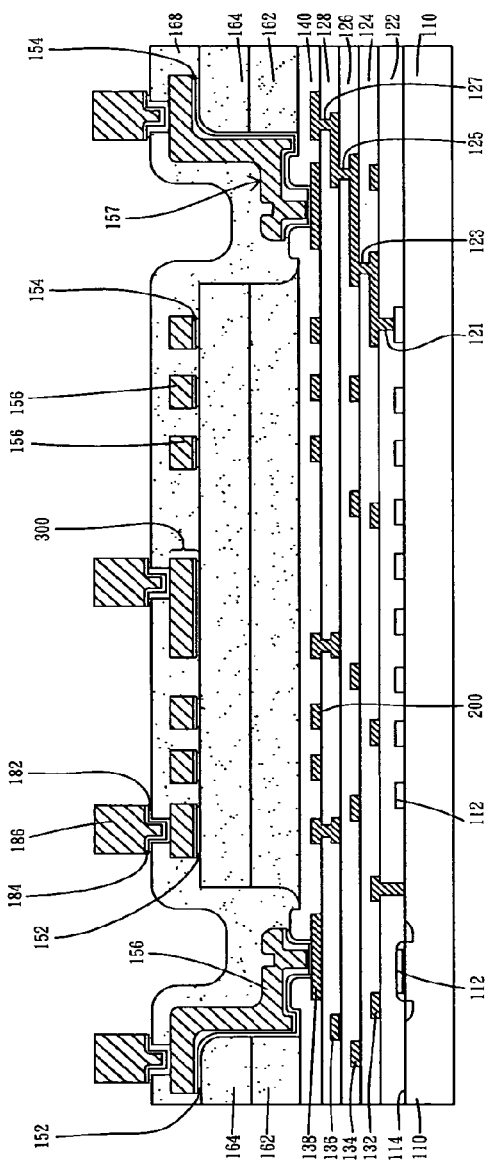

In FIG. 15, through gold bumps 186, the contact points 130 of the semiconductor chip and the top coil 300 can be connected to an external circuit, such as a printed circuit board (PCB), a ceramic substrate, a glass substrate or another semiconductor chip. The process for forming a redistribution circuit layer 157 is the same as the previous mentioned process for forming the top coil 300. First, an adhesion/barrier layer 152 of the previous mentioned material and thickness is formed on the polymer layer 164 and on the electric contact points 130 exposed by openings 142 in the passivation layer 140. Next, a seed layer 154 of the previous mentioned material and thickness is formed on the adhesion/barrier layer 152. Then, a photoresist layer is formed on the seed layer 154. Openings in the photoresist layer with the patterns of the top coil 300 and the redistribution line 157 expose the seed layer 154, wherein the opening with the pattern of the top coil 300 exposes the seed layer 154 on the polymer layer 164 and the openings with the pattern of the redistribution line 157 expose the seed layer 154 on the contact points 130, on the side wall of the openings in the polymer layers 162 and 164 and on the polymer layer 164. Next, a thick metal layer 156 of the previous mentioned material and thickness is formed on the seed layer 154 exposed by the openings in the photoresist layer. Then, the photoresist layer is removed. Subsequently, the seed layer 154 not under the thick metal layer 156 is removed. Next, the adhesion/barrier layer 152 not under the thick metal layer 156 is removed.

Then, by using the previous mentioned process, a polymer layer 168 is formed on the polymer layer 164, on the top coil 300 and on the redistribution circuit layer 157, wherein the polymer layer 168 is made of the previous mentioned material. Openings in the polymer layer 168 expose the contact points of the top coil 300 and the redistribution circuit layer 157.

Next, by using a sputtering process, an adhesion/barrier layer 182 made of, for example, an titanium tungsten alloy or titanium with a thickness of between 1000 and 6000 Angstroms is formed on the polymer layer 168 and the top coil 300 and the redistribution circuit layer 157 exposed by the openings in the polymer layer 168. Then, by using a sputtering process, a seed layer 184 made of, for example, gold with a thickness of between 500 and 5000 angstroms, is formed on the adhesion/barrier layer 182. Next, a photoresist layer is formed on the seed layer 184. Openings in the photoresist layer have a pattern of gold bumps 186 and expose the seed layer 184 on electric contact points of the top coil 300 and the redistribution circuit layer 157. Then, by using an electroplating process, a thick metal layer 186 made of, for example, gold with a thickness of between 5 and 30 micrometers, and preferably of between 15 and 20 micrometers, is formed on the seed layer 184 exposed by the openings in the photoresist layer. Next, the photoresist layer is removed. Then, the seed layer 184 not under the thick metal layer 186 is removed. Next, the adhesion/barrier layer 182 not under the thick metal layer 186 is removed. The bumps formed by the above mentioned process are suitable for a tape automated bonding (TAB) process, a Chip-On-Glass (COG) process or a Chip-On-Film (COF) process.

Figure 16:
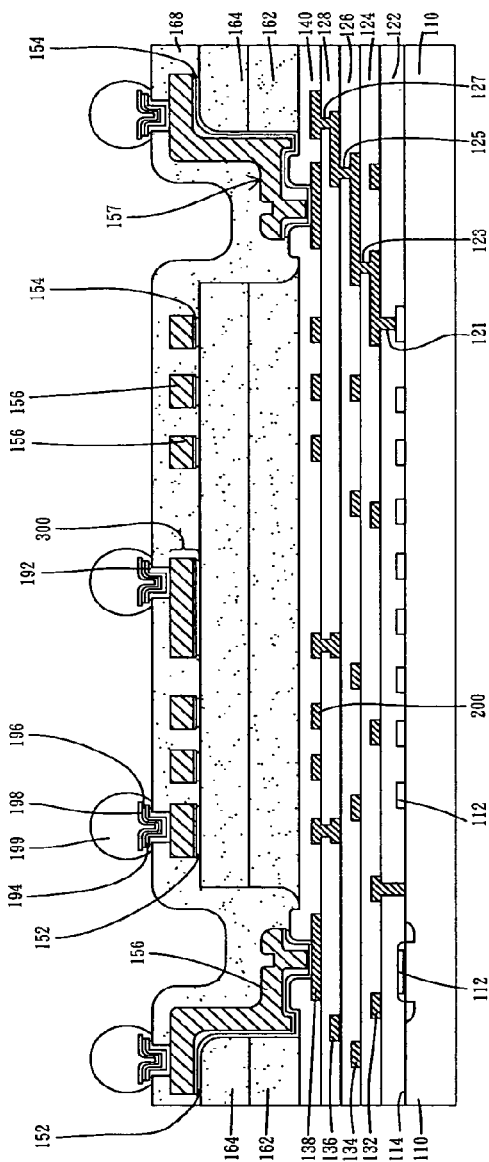

Alternatively, after forming the previous mentioned top coil 300 and the redistribution circuit layer 157, solder bumps can be formed on the top coil 300 and the redistribution circuit layer 157, as shown in FIG. 16. After forming the previous mentioned polymer layer 168, using a sputtering process, an adhesion/barrier layer 192 made of, for example, TiW, Ti, Cr, CrCu, Ta, TaN or TiN with a thickness ranging from 1000 to 6000 Angstroms is formed on the polymer layer 168, and on the electric contact points of the top coil 300 and the redistribution circuit layer 157 exposed by the openings in the polymer layer 168. Next, using a sputtering process, a seed layer made of, for example, copper with a thickness of between 500 and 5000 Angstroms is formed on the adhesion/barrier layer 192. Next, a photoresist layer is formed on the seed layer 194, wherein openings in the photoresist layer expose the seed layer 194 on the contact points of the top coil 300 and the redistribution circuit layer 157. Then, by using an electroplating process, a copper layer 196 with a thickness of between 1 and 10 micrometers is formed on the seed layer 194 exposed by the openings in the photoresist layer. Next, by using an electroplating process, a nickel layer 198 with a thickness of between 1 and 5 micrometers is formed on the copper layer 198 exposed by the openings in the photoresist layer. Next, a solder layer 199 made of, for instance, tin-lead alloy, tin-silver alloy or tin-silver-copper alloy with a thickness of between 50 and 500 micrometers, and preferably between 80 and 200 micrometers, is formed on the nickel layer 198 exposed by the openings in the photoresist layer. Next, the photoresist layer is removed. Then, the seed layer 194 not under the solder layer 199 is removed. Next, the adhesion/barrier layer 192 not under the solder layer 199 is removed. Next, by using a reflow process, the solder layer 199 can be made as a ball shape. The bumps formed by the above mentioned process is suitable for a flip-chip process to connect the semiconductor chip to a printed circuit board (PCB), a ceramic substrate or another semiconductor chip.

In the above mentioned case, the thick polymer layers 162, 164 and 166 are between the top coil 300 and the silicon substrate 110. Therefore, the impact caused by the change of the magnetic field of the top coil 300 on the silicon substrate 110 is reduced. The eddy current appearing in the silicon substrate is declined. The parasitic capacitance between the top coil 300 and the silicon substrate 110 is reduced.

Figure 17:
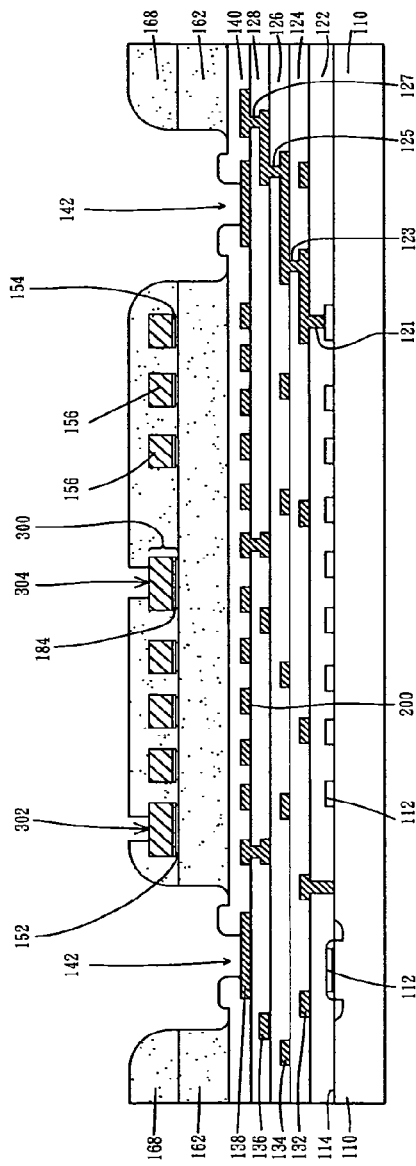
FIG. 17 is a cross-sectional view showing a semiconductor chip with a coil over a passivation layer according to the present invention, wherein the number of turns of a bottom coil is greater than that of a top coil.

FIG. 17 is a schematic view showing the top coil and the bottom coil with different turns. The transformer or coupler of the present invention is composed of the top coil 300 and the bottom coil 200. The number of turns of the top coil 300 may be different from that of the bottom coil 200. It depends on the need of electric design. A ratio of the number of turns of the top coil 300 to that of the bottom coil ranges from 5:1 to 1:100000. Another important characteristic of the present invention is design accuracy. A designer can use computer simulation tools to calculate an inductance L, a mutual inductance M, a resistance and a capacitance C with a very high accuracy, up to the level of $\mu H$, $\mu \Omega$, and $\mu F$. A simulation result can be implemented by the above mentioned process or other semiconductor manufacturing process so that a transformer or a coupler with a high accuracy can be formed.

When a couple is designed, due to the polymer layers 162, 164 and 166 having an outstanding isolating ability, the operation of the top coil 300 is allowable in an adverse circumstances, such as being connected to an external circuit providing a high voltage. Even though the top coil 300 is connected to an external circuit providing a high voltage, the performance of the bottom coil 200 under the passivation layer 140 is not influenced. Therefore, such kind of signal, whose transmission is not suitable for a semiconductor chip, such as its voltage with a high average value and small amplitude, can be transmitted to the top coil 300 from an external circuit.

Figure 18:
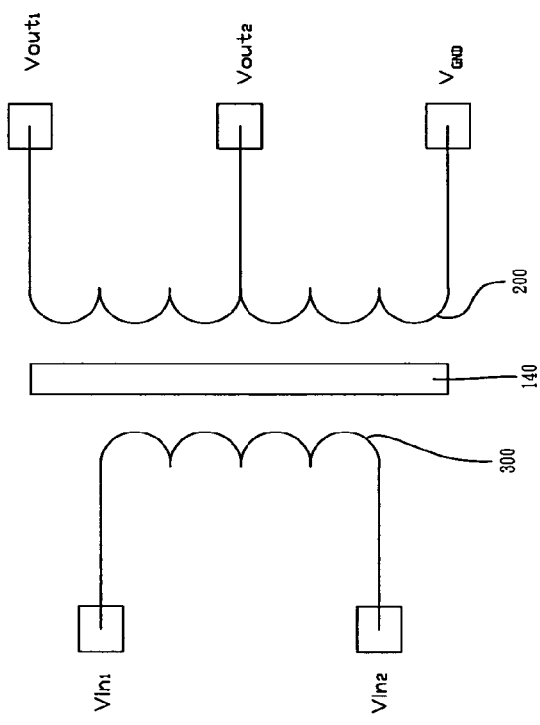
FIG. 18 is a schematic view of input/output contacts of top and bottom coils.
Figure 19:
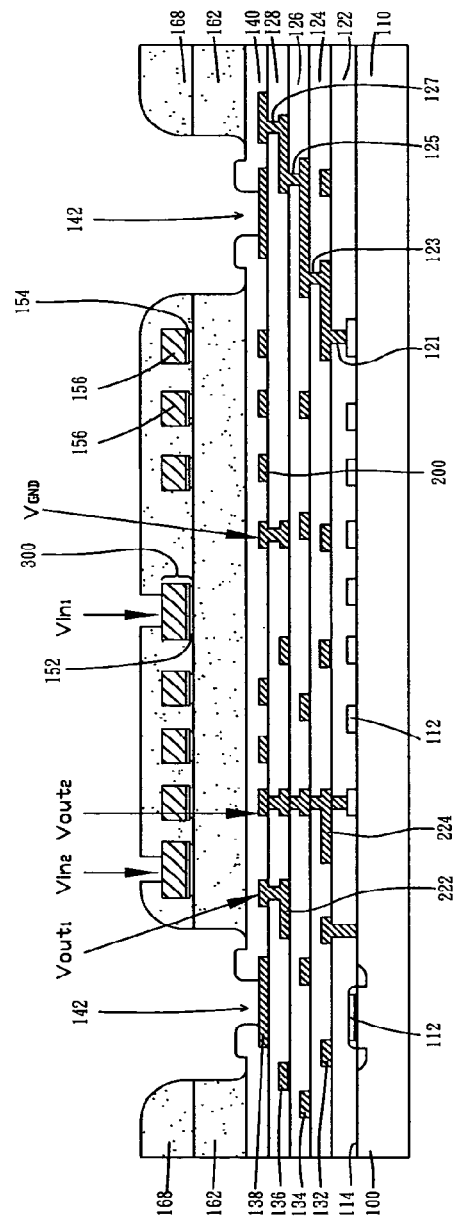
FIG. 19 is a cross-sectional view showing a semiconductor chip with a coil over a passivation layer according to the present invention, wherein there are top and bottom coils realizing the concept of FIG. 18.

The transformer or coupler of the present invention is provided with multiple input nodes and output nodes, shown in FIGS. 18 and 19, wherein FIG. 19 is an implementation of the concept of FIG. 18. $V_{in}$ represents input voltage. $V_{out}$ represents output voltage. $V_{GND}$ represents Ground voltage. If an alternating signal is input to the top coil 300, the electromagnetic field created by the voltage change from the top coil 300 leads to an induced electromotive force cerated on the bottom coil 200, the signal of the induced electromotive force can be transmitted to the electronic devices 112 to process the signal. The bottom coil is provided with, for example, two contact points offering two outputs Vout1 and Vout2 with different voltages for different functions. Therefore, different drive voltages can be provided from the bottom coil 200 to different power planes 222 or 224 or power bus to drive different electronic devices 112. $V_{out1}$ may indicate an induced electromotive force provided by the contact point farther from the middle point of the bottom coil 200. $V_{out2}$ may indicate an induced electromotive force provided by the contact point closer to the middle point of the bottom coil 200. For example, the voltage difference between $V_{out1}$ and $V_{GND}$ is 5 volts; the voltage difference between $V_{out2}$ and $V_{GND}$ is 3.3 volts. In other words, through the transformer or coupler of the present invention, different voltages can be applied to different electronic devices 112.

Figure 20:
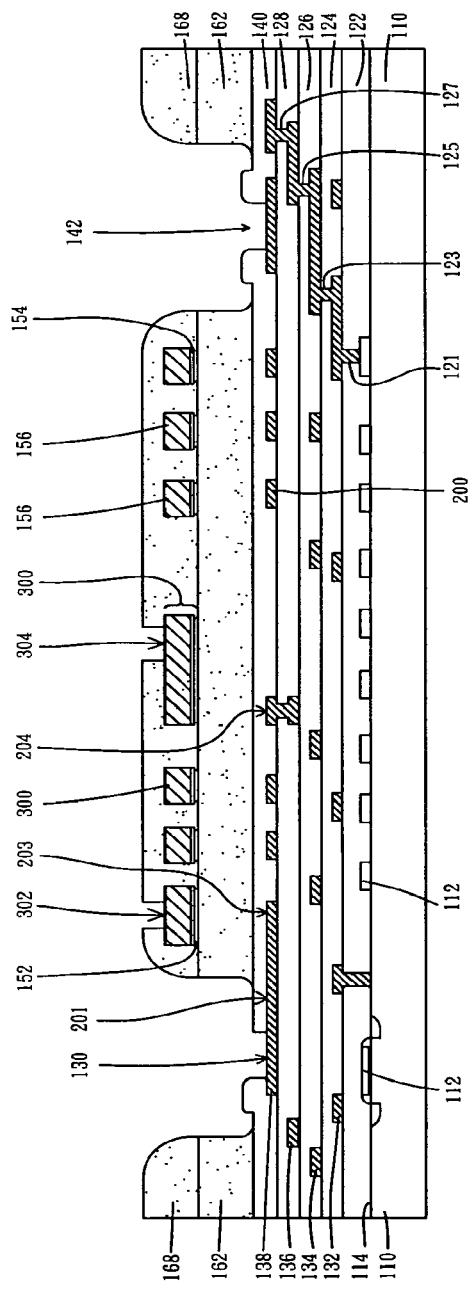
FIGS. 20-22 are cross-sectional views showing a semiconductor chip with a coil over a passivation layer according to the present invention, wherein a bottom coil can be connected to an external circuitry.
Figure 21:
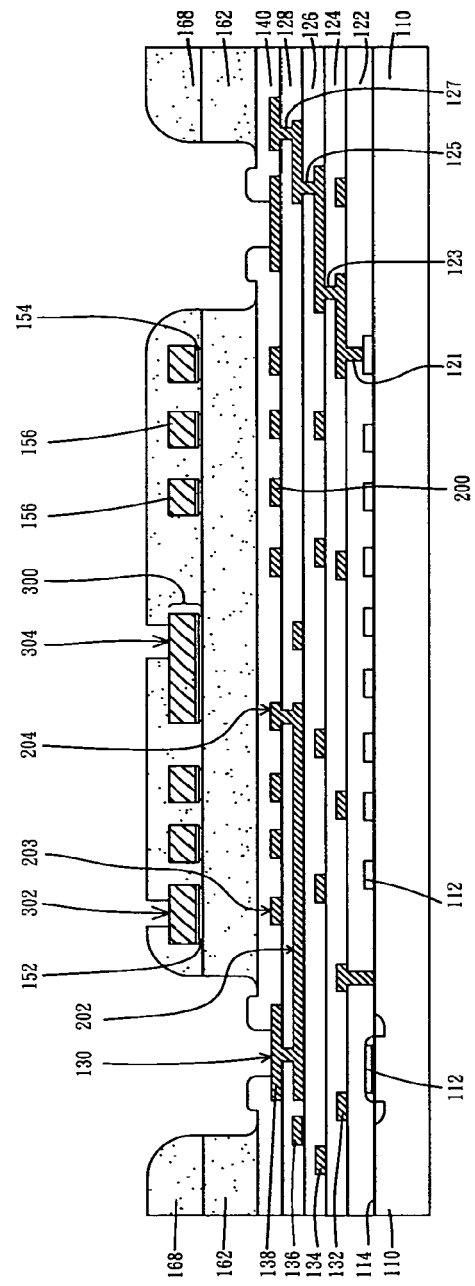

In another case, referring to FIG. 20 and FIG. 21, one terminal of the bottom coil 200 is connected though a trace 201 to a contact point 130 exposed by an opening 142 in the passivation layer 140, wherein the contact point 130 can be connected to the previous mentioned external circuit, such as a printed circuit board or another semiconductor chip, by using the previous mentioned method, such as a wirebonding method, solder bumping method or gold bumping method. In FIG. 20, a contact point 203 of the bottom coil 200 farther away from the middle point of the bottom coil 200 is connected to the contact point 130 through the connecting wire 201 of the thin-film circuit layer 138. A contact point 204 closer to the middle point of the bottom coil 200 is connected to the electronic devices 112 through the thin-film circuit layers 136, 134 and 132. In FIG. 21, the contact point 204 of the bottom coil 200 closer to the middle point of the bottom coil 200 is connected through the connecting wire 202 of the thin-film circuit layer 136 to the contact point 130. The contact point 203 of the bottom coil 200 farther away from the middle point of the bottom coil 200 is connected through thin-film circuit layer 136, 134, 132 to the electronic deices 112.

Figure 22:
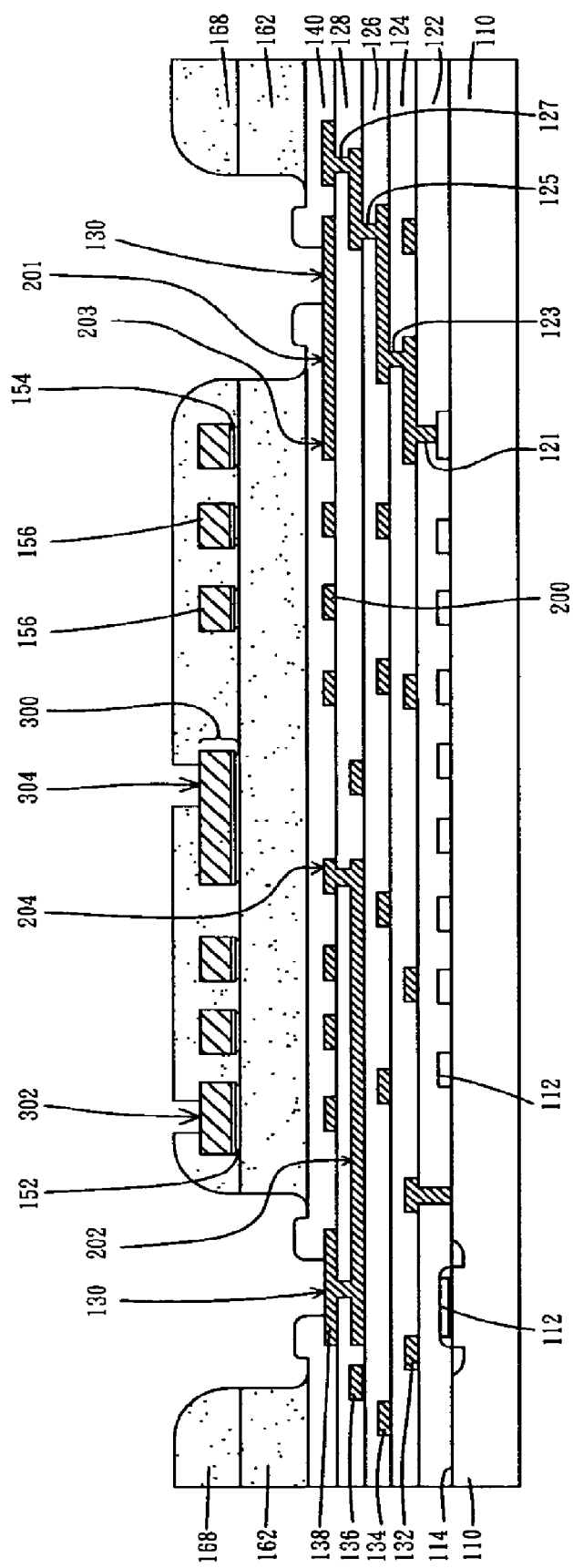

In another case, referring to FIG. 22, two terminals of the bottom coil 200 can be connected through traces 201 and 202 to the contact points 130 exposed by openings 142 in the passivation layer 140. These contact points 130 are electrically connected to the previous mentioned external circuit, such as a printed circuit board or another semiconductor chip, through the previous mentioned method, such as a wirebonding method, a solder bumping method or a gold bonding method. In this case, the contact point 204 of the bottom coil 200 closer to the middle point of the bottom coil 200 is connected through the connecting wire 202 of the thin-film circuit layer 136 to the left-sided contact point 130. The contact point 203 of the bottom coil 200 farther away from the middle point of the bottom coil 200 is connected through the connecting wire 201 of the thin-film circuit layer 138 to the right-sided contact point 130. As a result from this design, a change of voltage created from the bottom coil 200 is measurable.

Figure 23:
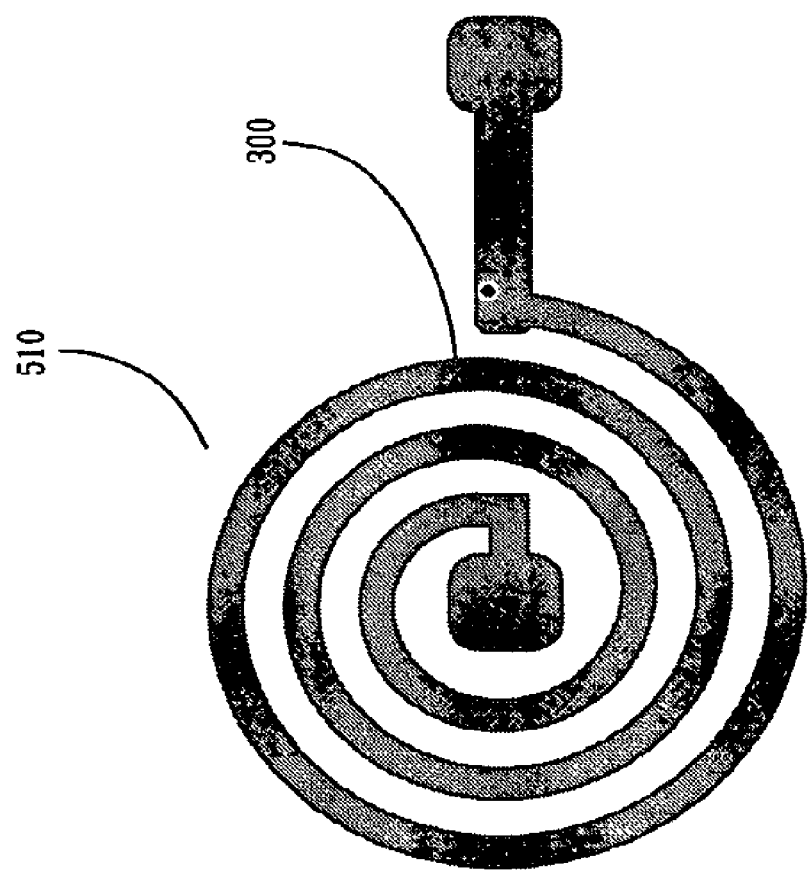
FIGS. 23a-23c are top views showing a top coil and a shielding ring, wherein the top coil is electrically disconnected from the shielding ring.
FIGS. 23d-23f are top views showing a bottom coil and a shielding ring, wherein the bottom coil is electrically disconnected from the shielding ring.
FIGS. 23g-23i are top views showing a top coil and a shielding ring, wherein the top coil is electrically connected with the shielding ring.
FIGS. 23j-23l are top views showing a bottom coil and a shielding ring, wherein the bottom coil is electrically connected with the shielding ring.
Figure 23:
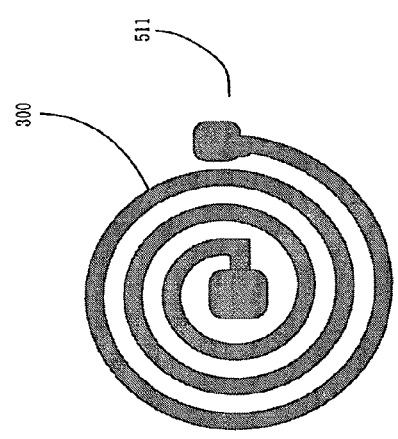
Figure 23:
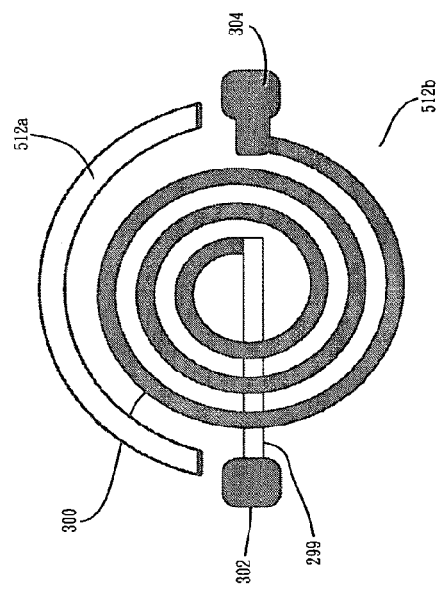
Figure 23:
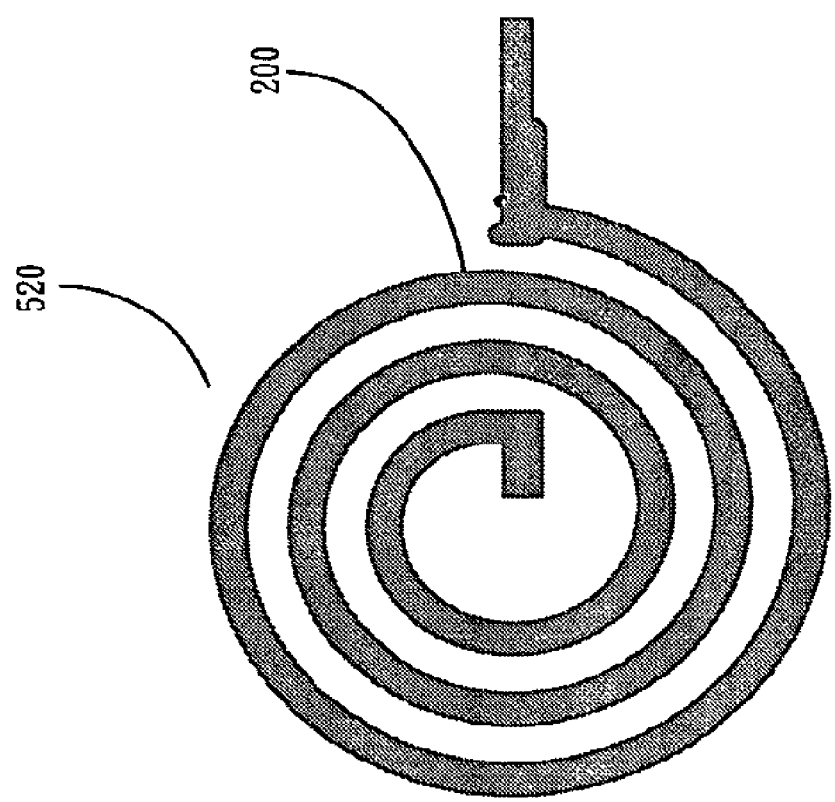
Figure 23:
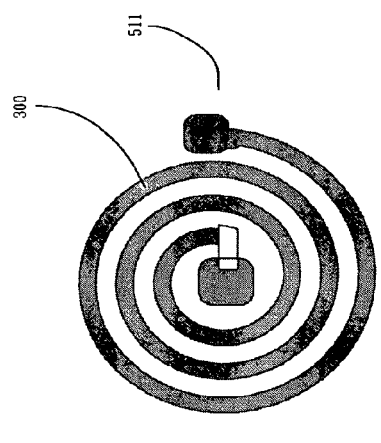
Figure 23:
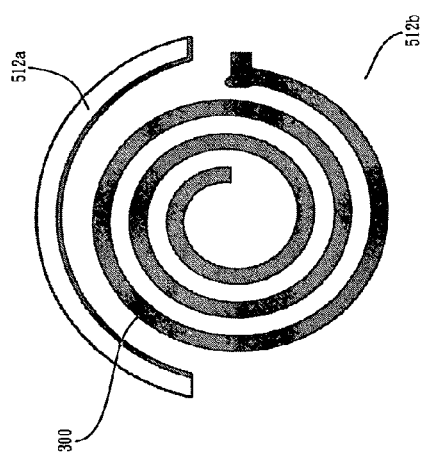
Figure 23:
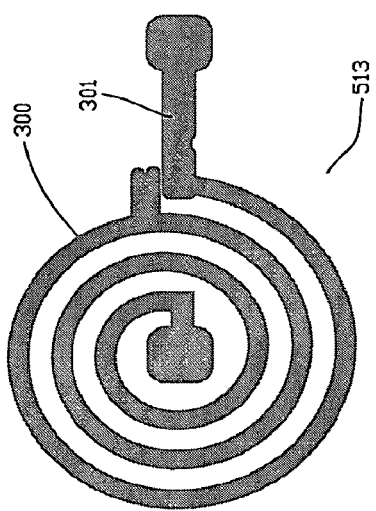
Figure 23:
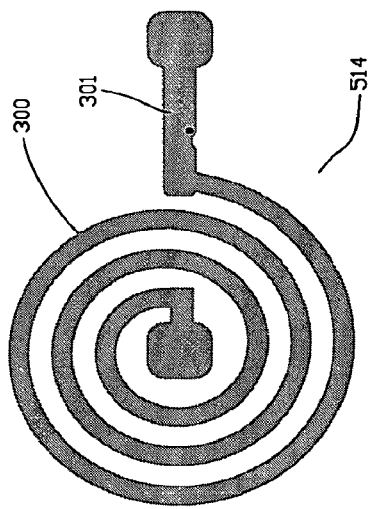
Figure 23:
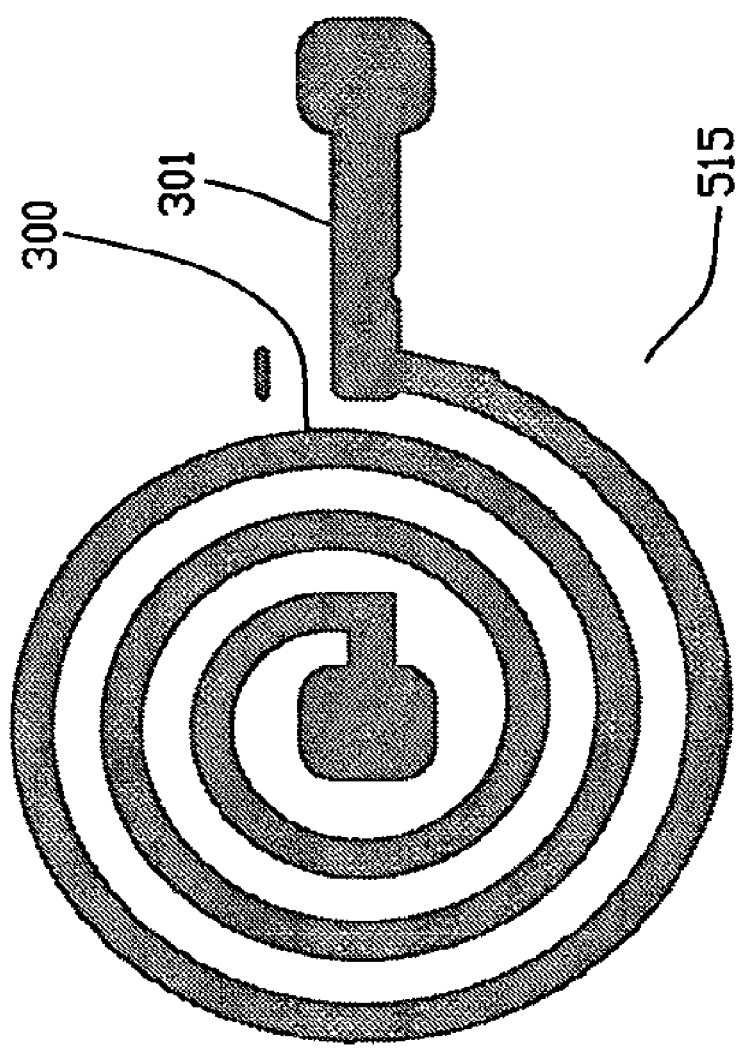
Figure 23:
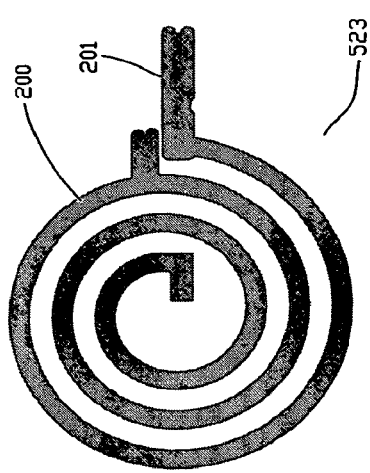
Figure 23:
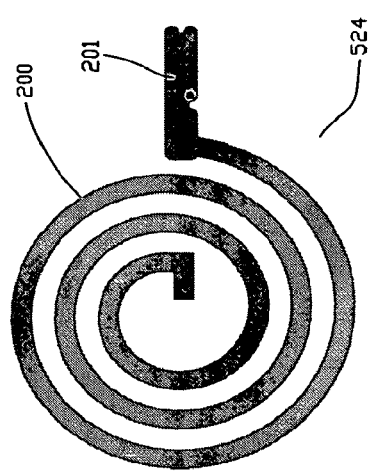
Figure 23:
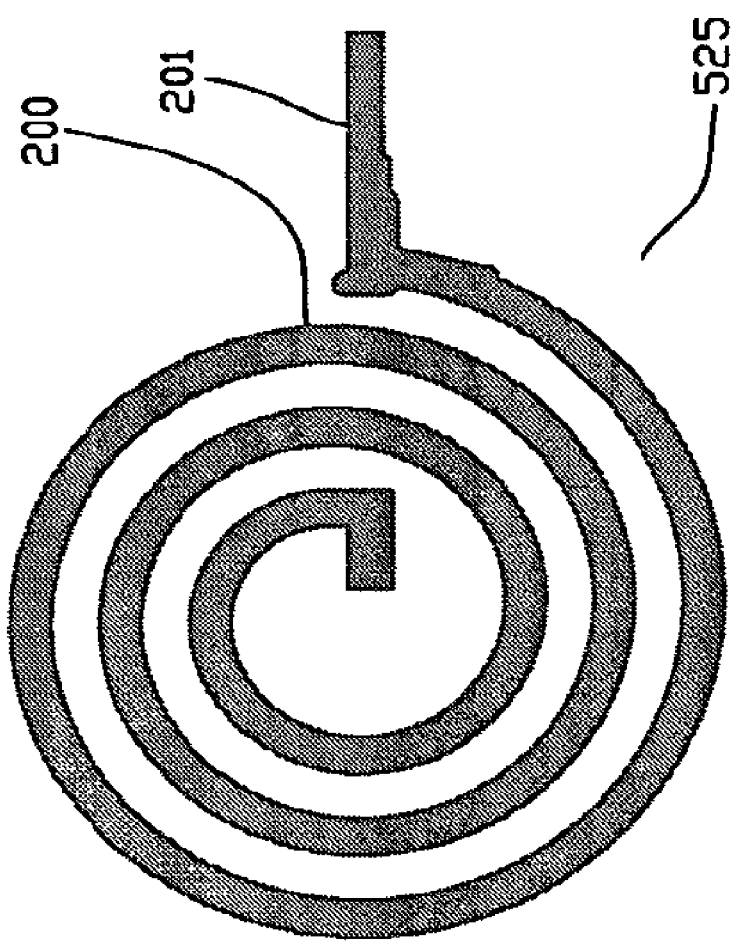

Shielding rings 510, 511, 512a and 512b may surround the top coil 300, as shown in FIGS. 23a, 23b and 23c. Shielding rings 510, 511, 512a and 512b and the top coil 300 may be provided by a same patterned metal layer, wherein the shielding rings 510, 511, 512a and 512b may be electrically disconnected from the top coil 300. The process for forming shielding rings 510, 511, 512a and 512b is the same as that for forming the top coil 300. First, an adhesion/barrier layer of the previous mentioned material and thickness is formed on a polymer layer or on a passivation layer. Next, a seed layer of the previous mentioned material and thickness is formed on the adhesion/barrier layer. Then, a photoresist layer is formed on the seed layer. Openings in the photoresist layer with the pattern of the top coil 300 and the shielding rings 510, 511, 512a and 512b expose the seed layer. Next, a thick metal layer of the previous mentioned material and thickness is formed on the seed layer exposed by the openings in the photoresist layer using an electroplating method. Then, the photoresist layer is removed. Subsequently, the seed layer not under the thick metal layer is removed. Next, the adhesion/barrier layer not under the thick metal layer is removed.

Shielding rings 510, 511, 512a and 512b surrounding the top coil 300 may have three profiles, as shown in FIGS. 23a, 23b and 23c. Referring to FIG. 23a, the shielding ring 510 is open. In other words, the shielding ring 510 does not become a loop. The width of the shielding ring 510 is substantially the same as that of each turn of the top coil 300. The space between the shielding ring 510 and the outermost turn of the top coil 300 is substantially the same as the space between the neighboring turns of the top coil 300. Referring to FIG. 23b, the shielding ring 511 is close. In other words, the shielding ring 511 becomes a loop. The width of the shielding ring 511 is substantially the same as that of each turn of the top coil 300. Referring to the FIG. 23c, the shielding ring 512a and 512b is open. In other words, the shielding ring 512a and 512b does not become a loop. The width of the shielding ring 512a and 512b is substantially the same as that of each turn of the top coil 300. The shielding ring can be composed of multiple arc fragments. In this case, the shielding ring is composed of two arc fragments 512a and 512b, called a top part and a bottom part, respectively. Two contact points 302 and 304 of the top coil 300 are located in the outer region of the top coil 300, wherein the contact point 302 is connected through a trace 299 between the top coil 300 and the bottom coil 200 to the innermost turn of the top coil 300.

In this case, the ration of the shortest distance between the shielding rings 510, 511, 512a and 512b and the outermost turn of the top coil 300 to the shortest distance between the neighboring turns of the top coil 300 is, for example, between 0.1 and 10, and preferably between 0.8 and 1.5. The ratio of a width of the shielding rings 510, 511, 512a and 512b to a width of the outermost turn of the top coil 300 is between 0.8 and 1.5, for example.

In another case, shielding rings 520, 521, 522a and 522b surround the bottom coil 200, as shown in FIGS. 23d, 23e and 23f. Shielding rings 520, 521, 522a and 522b and the bottom coil 200 are provided by a same patterned thin-film circuit layer under the passivation layer, wherein the shielding rings 520, 521, 522a and 522b are, for example, electrically disconnected from the bottom coil 200. The process for forming the shielding rings 520, 521, 522a and 522b is the same as that for forming the bottom coil 200. For example, the previous mentioned Damascene process can be used to form the shielding rings 520, 521, 522a and 522b and the bottom coil 200. Alternatively, the previous mentioned process of patterning a sputtered aluminum using photolithography and etching processes can be used to form the shielding rings 520, 521, 522a and 522b and the bottom coil 200.

Shielding rings 520, 521, 522a and 522b surrounding the bottom coil 200 may have three profiles, as shown in FIGS. 23d, 23e and 23f. Referring to FIG. 23d, the shielding ring 520 is open. In other words, the shielding ring 520 does not become a loop. The width of the shielding ring 520 is substantially the same as that of each turn of the bottom coil 200. The space between the shielding ring 520 and the outermost turn of the bottom coil 200 is substantially the same as the space between the neighboring turns of the bottom coil 200. Referring to FIG. 23e, the shielding ring 521 is close. In other words, the shielding ring 521 becomes a loop. The width of the shielding ring 521 is substantially the same as that of each turn of the bottom coil 200. Referring to the FIG. 23f, the shielding ring 522a and 522b is open. In other words, the shielding ring 522a and 522b does not become a loop. The width of the shielding ring 522a and 522b is substantially the same as that of each turn of the bottom coil 200. The shielding ring can be composed of multiple arc fragments. In this case, the shielding ring is composed of two fragments 522a and 522b, called a top part and a bottom part, respectively.

In this case, a ratio of the shortest distance between shielding rings 520, 521, 522a and 522b and the outermost turn of the bottom coil 200 to the shortest distance between the neighboring turns of the bottom coil 200 is, for example, between 0.1 and 10, and preferably between 0.8 and 1.5. The ratio of a width of the shielding rings 520, 521, 522a and 522b to a width of the outermost turn of the bottom coil 200 lies between 0.8 and 1.5, for example.

The present invention is not limited to the previous applications. A shielding ring can be electrically connected to the top coil, as shown in FIGS. 23g, 23h and 23i. Referring to FIG. 23g, a shielding ring 513 is electrically connected to the top coil 300. The width of the shielding ring 513 is substantially the same as that of each turn of the top coil 300. The space between the shielding ring 513 and the outermost turn of the top coil 300 is substantially the same as that of the neighboring turns of the top coil 300. One terminal of the shielding ring 513 is connected close to the region connecting the outermost turn and the second outermost turn of the top coil 300. The other terminal of the shielding ring 513 is connected to a trace 301 connected to the top coil 300.

Referring to FIG. 23h, a shielding ring 514 is electrically connected to the top coil 300. The width of the shielding ring 514 is substantially the same as that of each turn of the top coil 300. The space between the shielding ring 514 and the outermost turn of the top coil 300 is substantially the same as that of the neighboring turns of the top coil 300. One terminal of the shielding ring 514 is connected to the junction connecting the outermost turn of the top coil 300 and the trace 301. The other terminal of the shielding ring 514 is connected to the trace 301 connected to the top coil 300.

Referring to FIG. 23i, a shielding ring 515 is electrically connected to the top coil 300. The width of the shielding ring 515 is substantially the same as that of each turn of the top coil 300. The space between the shielding ring 515 and the outermost turn of the top coil 300 is substantially the same as that of the neighboring turns of the top coil 300. One terminal of the shielding ring 515 is open and not connected to the top coil 300. The other terminal of the shielding ring 515 is connected to the trace 301 connected to the top coil 300.

In this case, The ratio of the shortest distance between the shielding rings 513, 514 and 515 and the outermost turn of the top coil 300 to the shortest distance between the neighboring turns of the top coil 300 lies between 0.1 and 10, and, preferably, between 0.8 and 1.5. The ratio of the width of the shielding rings 513, 514 and 515 to the width of the outermost turn of the top coil 300 lies between 0.8 and 1.5.

The present invention is not limited to the previous applications. A shielding ring can be electrically connected to the bottom coil, as shown in FIGS. 23j, 23k and 23l. Referring to FIG. 23j, a shielding ring 523 is electrically connected to the bottom coil 200. The width of the shielding ring 523 is substantially the same as that of each turn of the bottom coil 200. The space between the shielding ring 523 and the outermost turn of the bottom coil 200 is substantially the same as that of the neighboring turns of the bottom coil 200. One terminal of the shielding ring 523 is connected close to the region connecting the outermost turn and the second outermost turn of the bottom coil 200. The other terminal of the shielding ring 523 is connected to a trace 201 connected to the bottom coil 200.

Referring to FIG. 23k, a shielding ring 524 is electrically connected to the bottom coil 200. The width of the shielding ring 524 is substantially the same as that of each turn of the bottom coil 200. The space between the shielding ring 524 and the outermost turn of the bottom coil 200 is substantially the same as that of the neighboring turns of the bottom coil 200. One terminal of the shielding ring 524 is connected to the junction connecting the outermost turn of the bottom coil 200 and the trace 201. The other terminal of the shielding ring 524 is connected to the trace 201 connected to the bottom coil 200.

Referring to FIG. 23l, a shielding ring 525 is electrically connected to the bottom coil 200. The width of the shielding ring 525 is substantially the same as that of each turn of the bottom coil 200. The space between the shielding ring 525 and the outermost turn of the bottom coil 200 is substantially the same as that of the neighboring turns of the bottom coil 200. One terminal of the shielding ring 525 is open and not connected to the bottom coil 200. The other terminal of the shielding ring 525 is connected to the trace 201 connected to the bottom coil 200.

In this case, a ratio of the shortest distance between the shielding rings 523, 524, 525 and the outermost turn of the bottom coil 200 to the shortest distance between the neighboring turns of the bottom coil 200 lies, for example, between 0.1 and 10, and preferably between 0.8 and 1.5. The ratio of the width of the shielding rings 523, 524 and 525 to the width of the outermost turn of the bottom coil 200 lies between 0.8 and 1.5.

In a case, one kind of the shielding rings 510, 511, 512a, 512b, 513, 514 and 515 is around the top coil 300, but no shielding ring is around the bottom coil 200. Alternatively, one kind of the shielding rings 520, 521, 522a, 522b, 523, 524 and 525 is around the bottom coil 200, but no shielding ring is around the top coil 300. Alternatively, one kind of the shielding rings 520, 521, 522a, 522b, 523, 524 and 525 is around the bottom coil 200, and one kind of the shielding rings 510, 511, 512a, 512b, 513, 514 and 515 is around the top coil 300.

Referring to FIGS. 23a-23l, the shielding rings 510, 511, 512a, 512b, 513, 514, 515, 520, 521, 522a, 522b, 523, 524 and 525 can effectively shield off the electromagnetic field coming from the radial directions in parallel with the plane of the coils 300 and 200. Due to forming the shielding rings 510, 511, 512a, 512b, 513, 514, 515, 520, 521, 522a, 522b, 523, 524 and 525, the profile of the outermost ring of the top coil 300 or the bottom coil 200 can be better controlled.

Figure 24A:
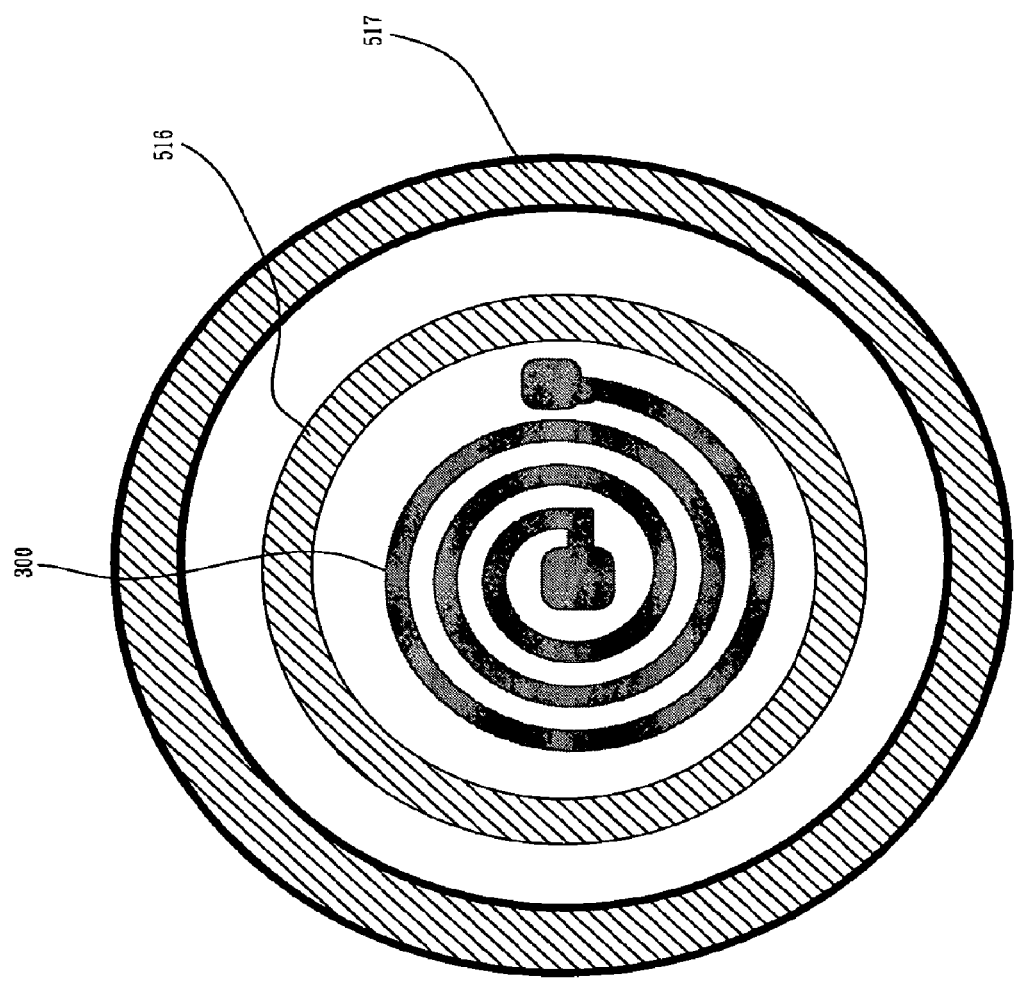
FIG. 24a is a top view showing a top coil and a shielding ring, wherein the shield ring has multiple turns.
Figure 24:
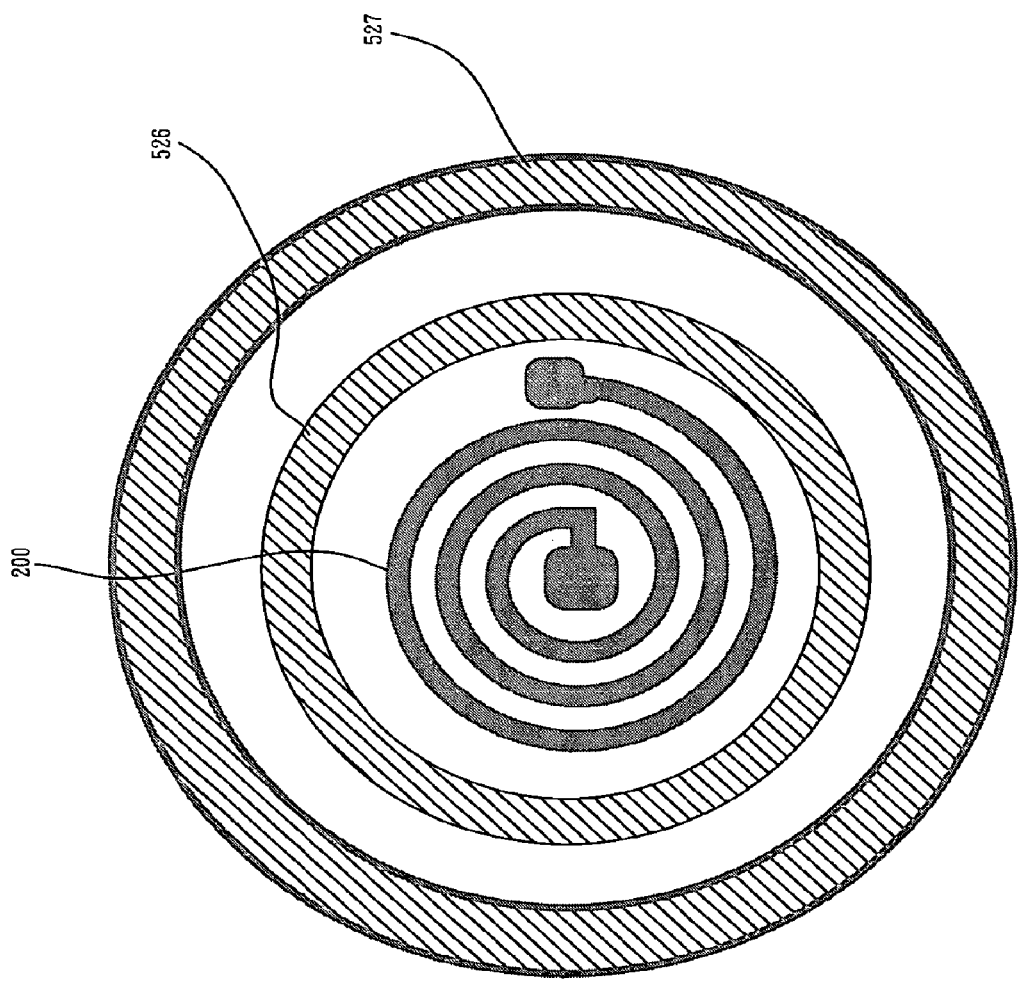
FIG. 24b is a top view showing a bottom coil and a shielding ring, wherein the shield ring has multiple turns.

It is not limited to the shielding ring with only one turn. An increase in number of the turns of the shielding rings is accessible depending on practical needs. For example, two turns of the shielding rings 516 and 517 surround the top coil 300, as shown in FIG. 24a. The shielding rings 516 and 517 are close and become individual loops, respectively, wherein the shielding ring 516 surrounds the top coil 300 and the shielding ring 517 surrounds the shielding ring 516. Alternatively, two turns of shielding rings 526 and 527 surround the bottom coil 200, as shown in FIG. 24b. The shielding rings 526 and 527 are close and become individual loops, respectively, wherein the shielding ring 526 surrounds the bottom coil 200 and the shielding ring 527 surrounds the shielding ring 526.

Figure 25:
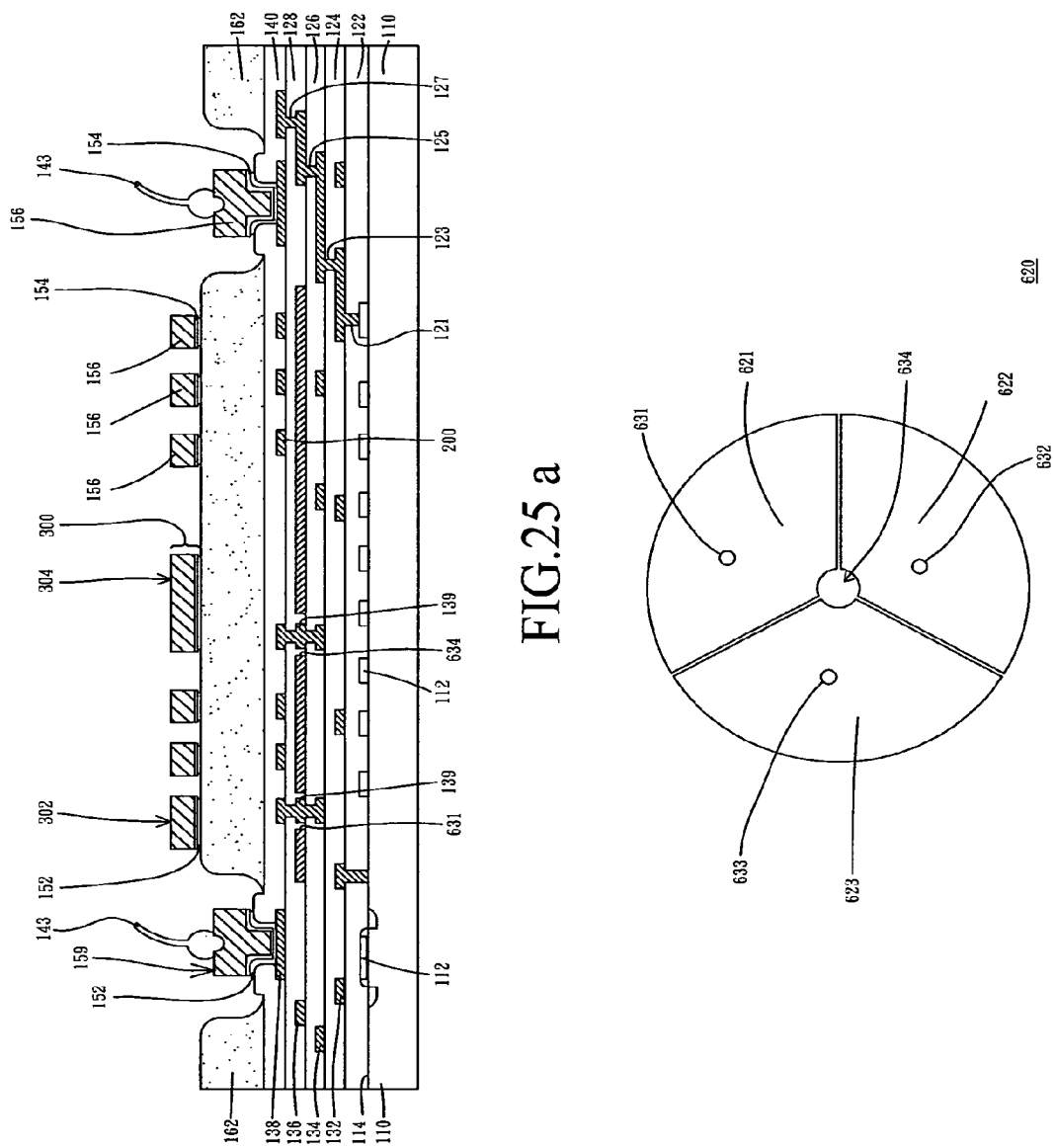
FIG. 25a is a cross-sectional view showing a semiconductor chip with a coil over a passivation layer according to the present invention, wherein there is a shielding plate under a bottom coil.
FIG. 25b is a top view showing a shield plate according to the present invention.

Referring to FIGS. 25a and 25b, FIG. 25b is a top view of a shielding plate 620 in FIG. 25a. The shielding plate 620 is under a transformer or a coupler, or under the bottom coil 200. The shielding plate 620 covers more than 50% of a horizontal region between the bottom coil 200 and the semiconductor substrate 110. Preferably, the shielding plate 620 covers more than 80% of a horizontal region between the bottom coil 200 and the semiconductor substrate 110. The main function of the shielding plate 620 is to protect electronic devices 112 from being influenced by the electromagnetic field created from the transformer or coupler. To cut off the path of the eddy current, the shielding plate 620 can be composed of multiple metal plates 621, 622 and 623 electrically disconnected from each other. In this case, the shielding plate 620 is composed of three fan-shaped metal plates 621, 622 and 623. A via 139 may be formed in openings 631, 632 and 633 in the metal plates 621, 622 and 623 and is used to connect the bottom coil 200 and the electronic devices 112. A via 139 may be in an opening 634 in the central area of the shielding plate 620 and is used to connect the bottom coil 200 and the electronic devices. The via 139 is electrically disconnected from the metal plates 621, 622 and 623.

As to the process for forming the shielding plate 620, the shielding plate 620 can be formed by using the above mentioned metal damascene process, or by patterning sputtered aluminum using photolithography and etching processes.

FIG. 26 shows the thin-film circuit layers 132, 134, 136 and 138 formed by the above mentioned metal damascene process. The detailed process can be referred to FIG. 26a and FIG. 26b. First, an adhesion/barrier layer 732, such as tantalum (Ta), TaN, Ti or TiN, is sputtered on the bottom and side wall of openings in thin-film isolating layers 722 and 724 and on the top surface of the thin-film isolating layer 722. Next, a seed layer 734, such as copper, is sputtered on the adhesion/barrier layer 732. Then, a copper layer 736 is electroplated on the seed layer 734. Next, the electroplated copper layer 736, seed layer 734 and adhesion/barrier layer 732 outside the openings in the thin-film isolating layers 732 and 734 are removed by using a chemical mechanical polishing (CMP) process until the top surface of the thin-film isolating layer 722 is exposed. As to the structure of the thin-film circuit layer formed by this metal damascene process, the thin-film isolating layer comprises an electroplated copper layer 736, a seed layer 734 and an adhesion/barrier layer 732, such as Ta, TaN, Ti or TiN. The seed layer 734 and the adhesion/barrier layer 732 cover the bottom surface and the side wall of the electroplated copper layer 736. In this case, the bottom coil is formed by using the above mentioned metal damascene process.

In this case, Components can be referred to the above mentioned components with the same reference number. Reference number 110 represents a semiconductor substrate, such as silicon substrate, GaAs substrate, SiGe (silicon germanium) substrate, a silicon-on-insulator (SOI) substrate. Reference number 112 represents electronic devices, such as MOS devices, p-channel MOS devices, n-channel MOS devices, complementary MOS (CMOS) devices, BiCMOS devices, Bipolar Junction Transistor (BJT), diffusion area, resistor or capacitor. Reference number 122, 124, 126 and 128 represent thin-film isolating layers above an active surface 114 of the semiconductor substrate 110. These thin-film isolating layers 122, 124, 126 and 128 are made of, for instance, silicon oxide, tetraethylorthosilicate (TEOS) oxide, silicon nitride, or silicon oxynitride, all formed by a chemical vapor deposition (CVD) process. Alternatively, these thin-film isolating layers 122, 124, 126 and 128 can be spin-on-coated glass, fluorinated silica glass (FSG), SiLK, black diamond, ether, polyarylene, polybenzoxazole, porous silicon oxide and spin-on dielectrics with a $Si_wC_xO_yH_z$ composition and PECVD oxide. Each thin-film isolating layer 122, 124, 126 or 128 can be a composite layer or single isolating layer of at least one of the above mentioned materials. Materials for forming the thin-film isolation layer 122, 124, 126 and 128 may be, for instance, materials with low dielectric constant, such as less than 3 or super low dielectric constant, such as less than 2.2.

Reference number 140 indicates a passivation layer above the thin-film circuit layers 132, 134, 136 and 138. The passivation layer 140 can protect electronic devices 112 from being damaged by moisture and foreign ion contamination. The passivation layer 140 can prevent mobile ions (such as sodium ion), transition metals (such as gold, silver or copper) and other impurities from penetrating therethrough to damage electronic devices or thin circuits of transistors, poly silicon resistors and poly-poly capacitors. To reach the goal of the protection, the passivation layer 140 is usually made of silicon oxide, silicon nitride or silicon oxynitride.

In a first case, the passivation layer 140 can be formed by first depositing a silicon-oxide layer with a thickness of between 0.2 and 1.2 micrometers using a PECVD process, then depositing a silicon-nitride layer with a thickness of between 0.2 and 1.2 micrometers on the silicon-oxide layer using a PECVD process.

In another case, the passivation layer 140 can be formed by first depositing a silicon-oxide layer with a thickness of between 0.2 and 1.2 micrometers using a PECVD process, then depositing a silicon-oxynitride layer with a thickness of between 0.05 and 0.15 micrometers on the silicon-oxide layer using a PECVD process, and then depositing a silicon-nitride layer with a thickness of between 0.2 and 1.2 micrometers on the silicon-oxynitride layer using a PECVD process.

In another case, the passivation layer 140 can be formed by first depositing a silicon-oxynitride layer with a thickness of between 0.05 and 0.15 micrometers using a PECVD process, then depositing a silicon-oxide layer with a thickness of between 0.2 and 1.2 micrometers on the silicon-oxynitride layer using a PECVD process, and then depositing a silicon-nitride layer with a thickness of between 0.2 and 1.2 micrometers on the silicon-oxide layer using a PECVD process.

In another case, the passivation layer 140 can be formed by first depositing a first silicon-oxide layer with a thickness of between 0.2 and 0.5 micrometers using a PECVD process, then depositing a second silicon-oxide layer with a thickness of between 0.5 and 1 micron on the first silicon-oxide layer using a spin-coating process, then depositing a third silicon-oxide layer with a thickness of between 0.2 and 0.5 micrometers on the second silicon-oxide layer using a PECVD process, and then depositing a silicon-nitride layer with a thickness of between 0.2 and 1.2 micrometers on the third silicon-oxide layer using a PECVD process.

In another case, the passivation layer 140 can be formed by first depositing a silicon-oxide layer with a thickness of between 0.5 and 2 micrometers using a HDP-CVD process, and then depositing a silicon-nitride layer with a thickness of between 0.2 and 1.2 micrometers on the silicon-oxide layer using a PECVD process.

In another case, the passivation layer 140 can be formed by first depositing an undoped silicate glass (USG) layer with a thickness of between 0.2 and 3 micrometers, then depositing a layer of tetraethylorthosilicate (TEOS), borophosphosilicate glass (BPSG) or phosphosilicate glass (PSG) with a thickness of between 0.5 and 3 micrometers on the USG layer, and then depositing a silicon-nitride layer with a thickness of between 0.2 and 1.2 micrometers on the layer of TEOS, BPSG or PSG using a PECVD process.

In another case, the passivation layer 140 can be formed by optionally first depositing a first silicon-oxynitride layer with a thickness of between 0.05 and 0.15 micrometers using a PECVD process, then depositing a silicon-oxide layer with a thickness of between 0.2 and 1.2 micrometers optionally on the first silicon-oxynitride layer using a PECVD process, then optionally depositing a second silicon-oxynitride layer with a thickness of between 0.05 and 0.15 micrometers on the silicon-oxide layer using a PECVD process, then depositing a silicon-nitride layer with a thickness of between 0.2 and 1.2 micrometers on the second silicon-oxynitride layer or on the silicon-oxide layer using a PECVD process, then optionally depositing a third silicon-oxynitride layer with a thickness of between 0.05 and 0.15 micrometers on the silicon-nitride layer using a PECVD process, and then depositing a silicon-oxide layer with a thickness of between 0.2 and 1.2 micrometers on the third silicon-oxynitride layer or on the silicon-nitride layer using a PECVD process.

In another case, the passivation layer 140 can be formed by first depositing a first silicon-oxide layer with a thickness of between 0.2 and 1.2 micrometers using a PECVD process, then depositing a second silicon-oxide layer with a thickness of between 0.5 and 1 micrometers on the first silicon-oxide layer using a spin-coating process, then depositing a third silicon-oxide layer with a thickness of between 0.2 and 1.2 micrometers on the second silicon-oxide layer using a PECVD process, then depositing a silicon-nitride layer with a thickness of between 0.2 and 1.2 micrometers on the third silicon-oxide layer using a PECVD process, and then depositing a fourth silicon-oxide layer with a thickness of between 0.2 and 1.2 micrometers on the silicon-nitride layer using a PECVD process.

In another case, the passivation layer 140 can be formed by first depositing a first silicon-oxide layer with a thickness of between 0.5 and 2 micrometers using a HDP-CVD process, then depositing a silicon-nitride layer with a thickness of between 0.2 and 1.2 micrometers on the first silicon-oxide layer using a PECVD process, and then depositing a second silicon-oxide layer with a thickness of between 0.5 and 2 micrometers on the silicon-nitride layer using a HDP-CVD process.

In general, the passivation layer 140 has a thickness of greater than 0.35 micrometers. Preferably, the thickness of a layer of silicon nitride of the passivation layer 140 is usually larger than 0.3 micrometers. An opening 142 in the passivation layer 140 expose the contact points 130 of the top thin-film circuit layer 138. The opening 142 in the passivation layer 140 has a largest traverse dimension ranging, for example, from 0.1 micrometers to 20 micrometers. In the present invention, the largest traverse dimension of the opening 142 in the passivation layer 140 can be reduced to 0.1 micron. Therefore, the area of the electric contact points 130 can be very small. As a result, the routing ability of the topmost thin-film circuit layer 138 can be enhanced.

Openings 142 in the passivation layer 140 expose contact points 130 of the topmost thin-film circuit layer 138. To protect the contact points 130 exposed to the ambiant, a metal layer 131, such as aluminum or aluminum alloy, can be formed on the contact points 130. The metal layer 131 with a thickness ranging from 0.5 micrometers to 5 micrometers can be formed by using sputtering or evaporating process. Alternatively, this metal layer 131 may include a gold layer electroplated with a thickness of between 1 micron and 20 micrometers. This gold layer may be formed on an adhesion/barrier layer, such as TiW alloy or Ti, formed by a sputtering process. Between the adhesion/barrier layer and the contact points 130, there may be a layer of aluminum of aluminum alloy formed by a sputtering process with a thickness of between 0.5 micrometers and 5 micrometers.

After forming the metal layer 131, a polymer layer 168, such as polyimide or benzo-cyclobutene (BCB), is formed on the passivation layer 140 and the metal layer 131 by using a spin-on-coating process. Next, multiple openings are formed in the polymer layer 168 using a 1× stepper and through exposing and developing processes to expose the contact points to expose the metal layer 131. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 168 at the temperature of between 250 centigrade degrees and 450 centigrade degrees, lasting for more than 30 minutes. The polymer layer 168 after being cured is between 5 and 20 micrometers.

FIGS. 27-35 are schematical cross-sectional views showing a process of forming a metal wiring or a coil over a passivation layer 140 of a semiconductor wafer using an embossing process. Referring to FIG. 27, first, an adhesion/barrier layer 152 with a thickness of between 0.1 micrometers and 1 micron is formed on a polymer layer 262 by using a sputtering process. The adhesion/barrier layer may include Ti, W, Co, Ni, TiN, TiW, V, Cr, Cu, CrCu, Ta, TaN or a composite layer or single layer of at least one of the above-mentioned materials. Alternatively, the adhesion/barrier layer 152 can be formed by using an electroless plating process, a chemical vapor deposition (CVD) process, a sputtering process or an evaporating process. The adhesion/barrier layer 152 may enhance a bonding ability of a following deposited metal and the polymer layer 162.

Figure 28:
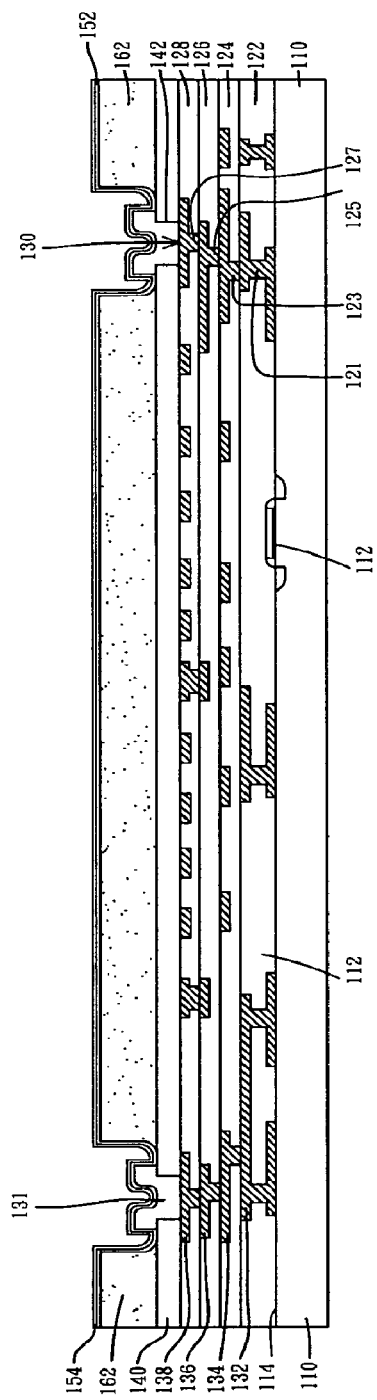

After forming the adhesion/barrier layer 152, a seed layer 154 can be formed on the adhesion/barrier layer 152 by using a sputtering process, an evaporating process or an electroless plating process, as shown in FIG. 28. The seed layer 154 has a thickness ranging from 0.05 micrometers to 1 micron. The seed layer 154 can be formed in a sputter chamber or an ion Metal Plasma chamber at the temperature of between 0 and 300 centigrade degrees and in the pressure of between 1 and 100 mTorr. Using copper or a copper alloy as a target, argon gas is introduced and its flow is controlled between 10 and 400 sccm.

Figure 29:
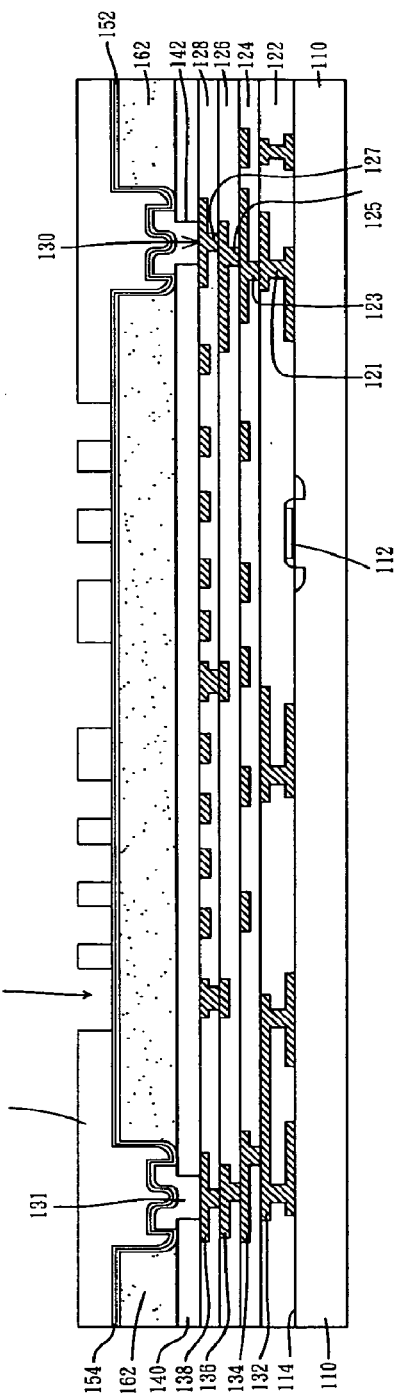

Next, referring to FIG. 29, a photoresist layer 170 is formed on the seed layer 154 by using a spin-on coating process. Then, multiple openings 172 are formed in the photoresist layer 170 by using 1× steppers and through exposing and developing processes to expose the seed layer 154. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. The thickness of the photoresist layer 170 ranges, for instance, from 2 micrometers to 100 micrometers, and preferably from 8 micrometers to 30 micrometers. The photoresist layer 170, such as a positive photoresist, is, for instance, napthoquinone diazide derivative.

Figure 30:
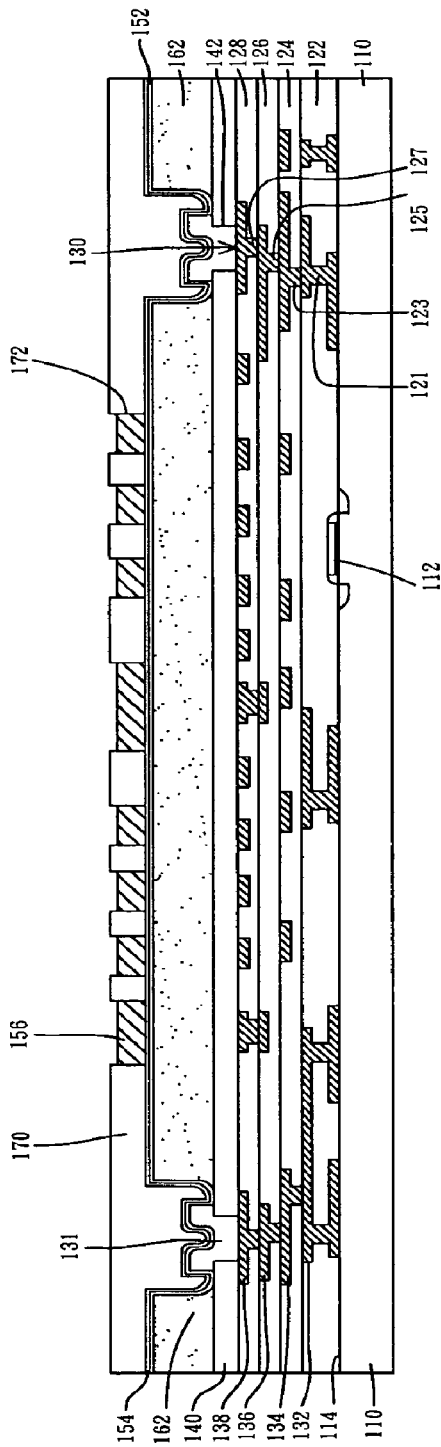

Then, as shown in FIG. 30, a thick metal layer 156 is formed on the seed layer 154 exposed by the openings 172 in the photoresist layer 170 by using an electroplating or an electroless plating process, wherein the electroplating process is preferable. The metal layer 156 includes gold (Au), silver (Ag), copper (Cu), nickel (Ni), palladium (Pd), platinum (Pt), rhodium (Ru), ruthenium (Re), tin-lead alloy, or tin-silver alloy or a composite layer or single layer of at least one of the above-mentioned materials. When a copper layer of the thick metal layer 156 is electroplated on the seed layer 154, copper is preferable as the material of the seed layer 154. When a gold layer of the thick metal layer 156 is electroplated on the seed layer 154, gold is preferable as the material of the seed layer 154. When a silver layer of the thick metal layer 156 is electroplated on the seed layer 154, silver is preferable as the material of the seed layer 154. When a palladium layer of the thick metal layer 156 is electroplated on the seed layer 154, palladium is preferable as the material of the seed layer 154. When a platinum layer of the thick metal layer 156 is electroplated on the seed layer 154, platinum is preferable as the material of the seed layer 154. When a rhodium layer of the thick metal layer 156 is electroplated on the seed layer 154, rhodium is preferable as the material of the seed layer 154. When a ruthenium layer of the thick metal layer 156 is electroplated on the seed layer 154, ruthenium is preferable as the material of the seed layer 154. When a nickel layer of the thick metal layer 156 is electroplated on the seed layer 154, nickelel is preferable as the material of the seed layer 154. The purpose of forming the seed layer 154 is to enhance the performance of electroplating the thick metal layer 156. The thickness of the metal layer 156 ranges from 0.1 micrometers to 30 micrometers.

If the electroplated thick metal layer 156 is made of gold, the thickness of the thick metal layer 156 ranges, for example, from 1 micron to 30 micrometers, and preferably from 1 micron to 15 micrometers. If the electroplated thick metal layer 156 is copper, the thickness of the thick metal layer 156 ranges, for example, from 1 micron to 30 micrometers. Alternatively, the thick metal layer 156 can be deposited by electroplating multiple metal layers. For example, the thick metal layer 156 can be deposited by first electroplating a copper layer with a thickness of between 1 micron and 30 micrometers on the seed layer 154 exposed by the openings 172 in the photoresist layer 170, next electroplating a nickel layer with a thickness of between 0.5 and 10 micrometers on the copper layer exposed by the openings 172 in the photoresist layer 170, and next electroplating a gold layer with a thickness of between 0.5 and 15 micrometers on the nickel layer exposed by the openings 172 in the photoresist layer 170.

An electrolyte for electroplating gold may contain sulphurous acid, sodium ion and gold ion, wherein The concentration of the gold ion in the electrolyte ranges, for example, from 5 gram per liter to 20 gram per liter. The temperature of the electrolyte is controlled, for example, between 30 centigrade degrees and 65 centigrade degrees. The PH value of the electrolyte lies, for example, between 6.5 and 9. The current density for electroplating gold lies, for example, between 1 microampere per square centimeter and 10 microampere per square centimeter. Alternatively, another electrolyte for electroplating gold may contain, for example, cyanide and potassium ion.

Figure 31:
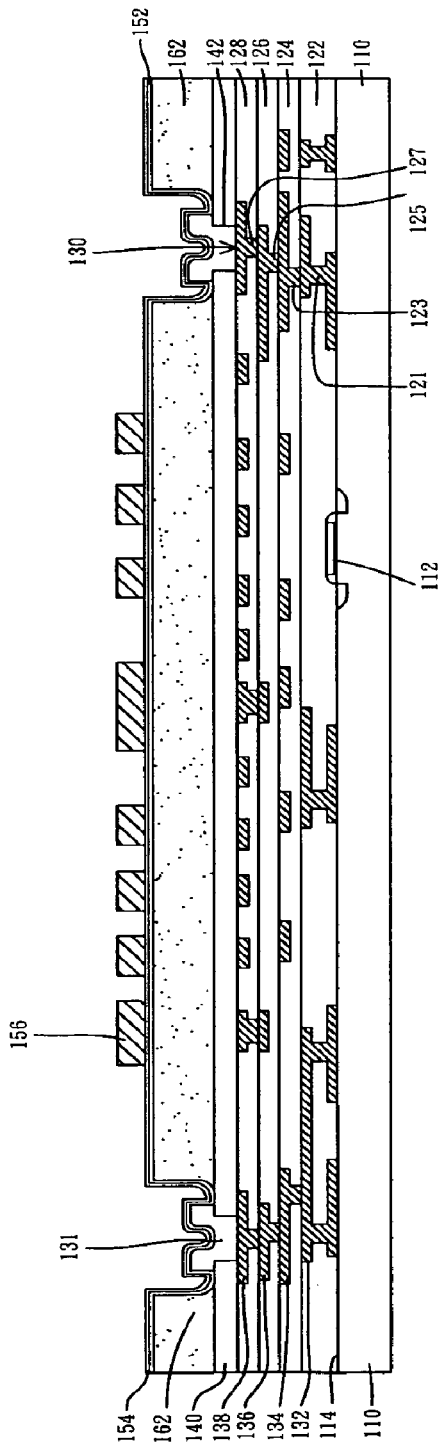
Figure 32:
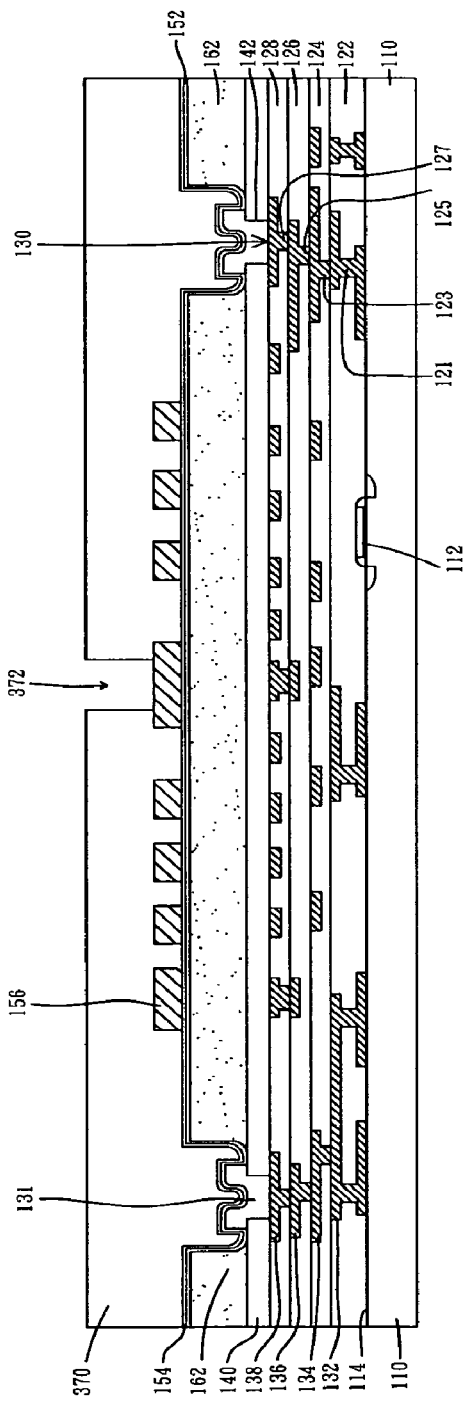

After forming the thick metal layer 156, the photoresist layer 170 is removed, as shown in FIG. 31. Then, referring to FIG. 32, a photoresist layer 370 is formed on the seed layer 154 and the thick metal layer 156 by using a spin-on-coating process. Then, multiple openings 372 are formed in the photoresist layer 370 by using 1× steppers and through exposing and developing processes to expose the thick metal layer 156. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. The thickness of the photoresist layer 370 ranges, for instance, from 2 micrometers to 100 micrometers, and preferably from 8 micrometers to 30 micrometers. The photoresist layer 370, such as a positive photoresist, is, for instance, napthoquinone diazide derivative.

Figure 33:
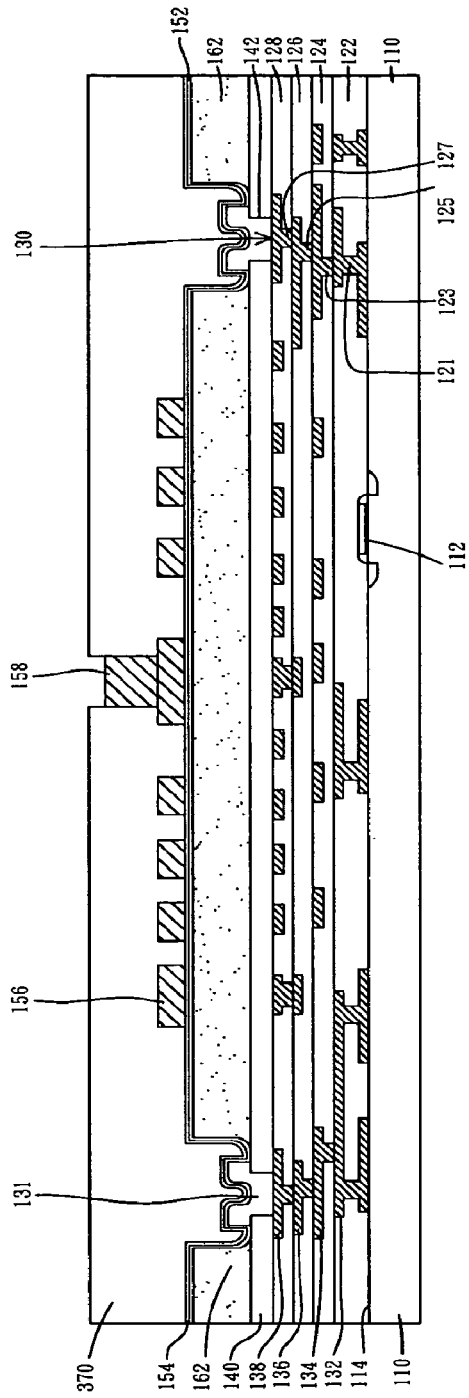

Then, a thick metal layer 158 with a thickness between 1 micron and 500 micrometers is formed on the thick metal layer 156 exposed by openings 372 in the photoresist layer 370 by using an electroplating process or an electroless plating process, wherein the electroplating process is preferable, as shown in FIG. 33. The metal layer 158 may include gold (Au), silver (Ag), copper (Cu), nickelel (Ni), palladium (Pd), platinum (Pt), rhodium (Ru), ruthenium (Re), tin-lead alloy, tin-silver alloy or a composite layer or single layer of at least one of the above mentioned materials.

If the electroplated thick metal layer 158 is made of gold, the thickness of the thick metal layer 158 ranges, for example, from 1 micron to 30 micrometers. If the electroplated thick metal layer 158 is a solder layer containing tin, the thickness of the thick metal layer 158 ranges, for example, from 50 micron to 350 micrometers. Alternatively, the thick metal layer 158 can be deposited by electroplating multiple metal layers. For example, the thick metal layer 158 is deposited by first electroplating a nickel layer with a thickness of between 1 micron and 10 micrometers on the thick metal layer 156 exposed by the openings 372 in the photoresist layer 370, and next electroplating a solder layer containing tin with a thickness of between 50 micrometers and 350 micrometers on the nickel layer exposed by the openings 372 in the photoresist layer 370.

An electrolyte for electroplating gold may contain sulphurous acid, sodium ion and gold ion, wherein The concentration of the gold ion in the electrolyte ranges, for example, from 5 gram per liter to 20 gram per liter. The temperature of the electrolyte is controlled, for example, between 30 centigrade degrees and 65 centigrade degrees. The PH value of the electrolyte lies, for example, between 6.5 and 9. The current density for electroplating gold lies, for example, between 1 microampere per square centimeter and 10 microampere per square centimeter. Alternatively, another electrolyte for electroplating gold may contain, for example, cyanide and potassium ion.

Figure 34:
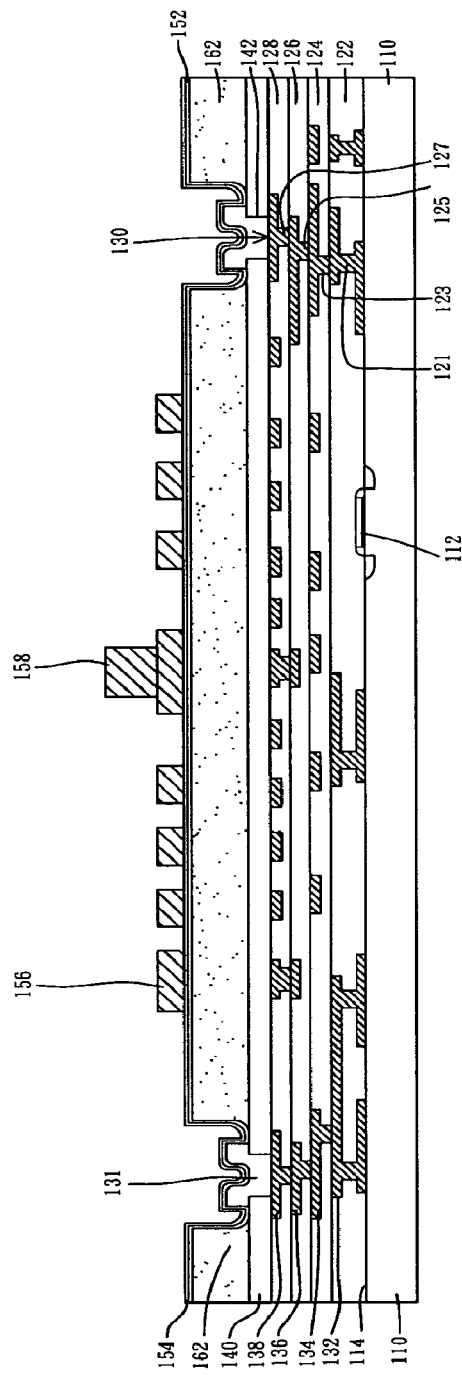
Figure 35:
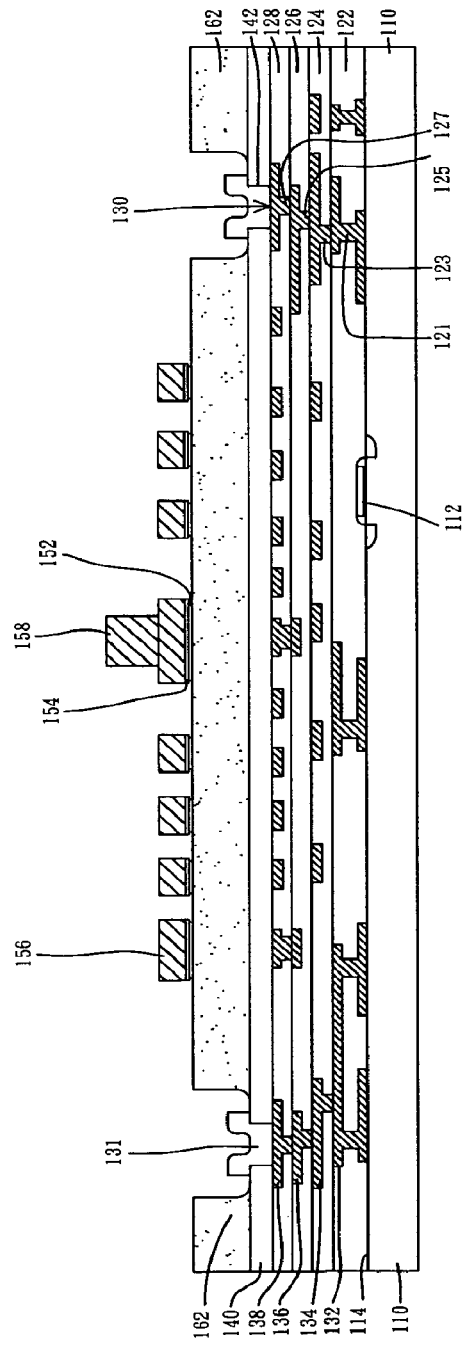

After forming the thick metal layer 158, the photoresist layer 370 is removed, as shown in FIG. 34. Then, acting the thick metal layer 156 as an etching mask, the seed layer 154 and the adhesion/barrier layer 152 not covered by the thick metal layer 156 are removed by a self-aligned wet etching process. Only the seed layer 154 and the adhesion/barrier layer 152 under the thick metal layer 156 are left. An undercut is formed around the adhesion/barrier layer 152 and inwardly and laterally extends under the seed layer 154, as shown in FIG. 35, wherein the lateral depth of the undercut ranges, for example, from 0.03 micrometers to 2 micrometers and depends on the etching factors and over-etch time. If gold is formed for the seed layer 154, an etchant containing Iod can be used to etch the seed layer 154. If a titanium-tungsten alloy is formed for the adhesion/barrier layer 152, an etchant containing hydrogen peroxide can be used to etch the adhesion/barrier layer 152.

In this case, the thick metal layer 156 acts as the main component of the top coil 300. Preferably, the thick metal layer 156 includes a gold or copper layer with a thickness of between 1 micron and 15 micrometers. If the thick metal layer 158 is connected with a conductive wire formed by a wirebonding process, this thick metal layer 158 may comprises a gold layer with a thickness of between 1 micron and 30 micrometers, and preferably between 1 micron and 15 micrometers. Alternatively, if the thick metal layer 158 acts as a bump used to joined with a pad of an external circuitry, this thick metal layer 158 comprises a gold layer with a thickness of between 10 micrometers and 30 micrometers, or comprises a tin-lead alloy layer or a tin-silver alloy layer with a thickness of between 50 micrometers and 350 micrometers. The above mentioned thick metal layer 158 acting as wirebonded pads or bumps is formed on pads 304 of the top coil 300.

Figure 36:
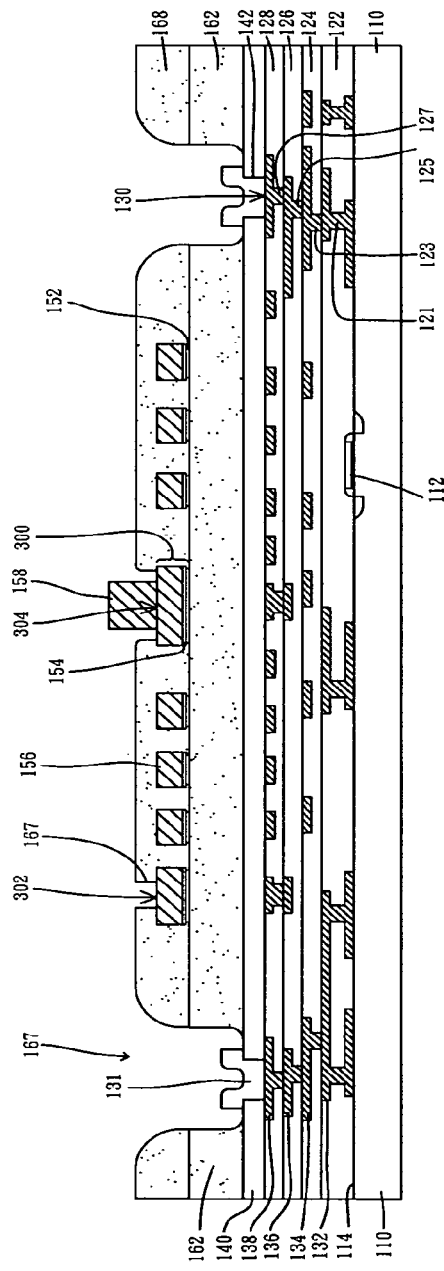
FIGS. 36 and 37 are cross-sectional views showing a semiconductor chip with a coil over a passivation layer according to the present invention
Figure 37:
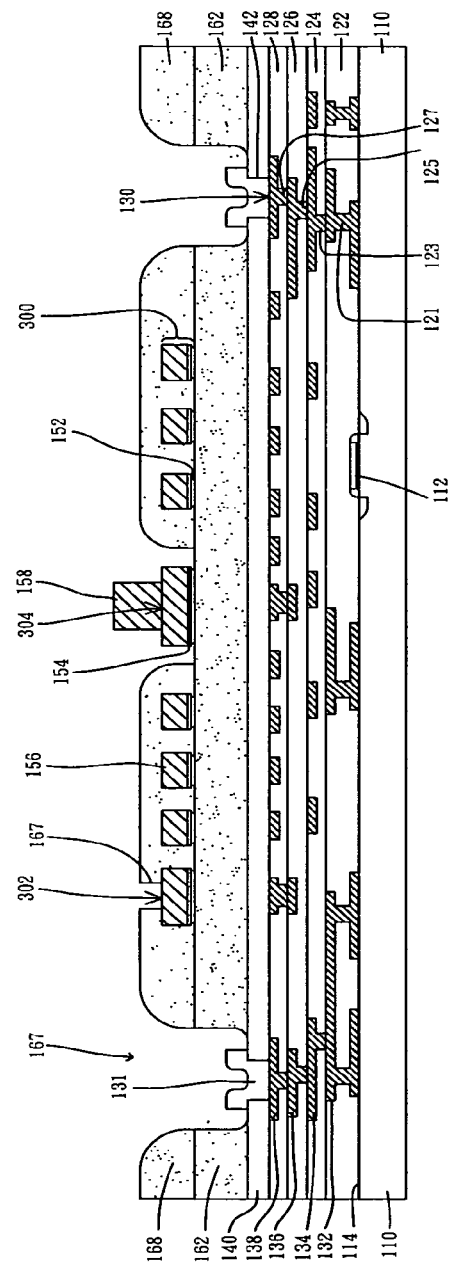

Next, referring to FIGS. 36 and 37, A polymer layer 168, such as polyimide or benzo-cyclobutene (BCB), can be formed on the polymer layer 162 and the top coil 300 by using a spin-on-coating process. Then, multiple openings 167 are formed in the polymer layer 168 by using 1× steppers and through exposing and developing processes to expose a contact point 302 of the top coil 300, the thick metal layer 158 acting as wirebonded pads or bumps, and the metal layer 131. During the exposing process, a light (G-line) with a wavelength of between 434 nanometers and 437 nanometers may be used. During the exposing process, a light (H-line) with a wavelength of between 403 nanometers and 406 nanometers may be used. During the exposing process, a light (I-line) with a wavelength of between 364 nanometers and 366 nanometers may be used. Next, a heating process is used to cure the polymer layer 168 at the temperature of between 250 centigrade degrees and 450 centigrade degrees lasting for more than 30 minutes. The thickness of the polymer layer 168 after being curred ranges from 5 micrometers to 20 micrometers. In FIG. 36, the polymer layer 168 covers the peripherial area of the contact point 304 of the top coil 300. Alternatively, referring to the FIG. 37, an opening in the polymer layer 168 thoroughly exposes the contact point 304 of the top coil 300. The polymer layer 168 does not cover the contact point 304 of the top coil 300.

In addition, there may be multiple polymer layers, such as two polymer layers 162 and 164 as shown in FIG. 10, or three polymer layers 162, 164 and 166 as shown in FIG. 11, between the passivation layer 140 and the top coil 300. Alternatively, the deposition of the polymer layer 162 can be saved, so that the top coil 300 is formed on and in touch with the passivation layer 140. In this case, the perpendicular distance between the top coil 300 and the bottom coil 200 lies, for instance, between 0.1 micron and 500 micrometers, and preferably between 0.5 micron and 50 micrometers.

Alternatively, the concept for forming the top coil 300 and the thick metal layer 158 shown in FIGS. 26-37 can be accomplished over the bottom coil 200 formed by sputtered aluminum or sputtered aluminum alloy.

The present invention has the following advantages:

1. The structures and pitches of the top coil and the bottom coil are different. As to the bottom coil under a passivation layer, the process for forming the same is a damascene copper process or a process with patterning sputtered aluminum, whereby a fine-pitch circuit can be formed for forming the bottom coil. The allowable pitch of a process for forming the top coil over the passivation layer is coarse.

2. There may be a thick polymer layer between the top coil and the bottom coil.

3. There may be a magnetic material between the top coil and the bottom coil, wherein the magnetic material is preferably a ferromagnet material.

4. The top coil can bear a high current or high current density reaching, for example, 106 Amp/cm2.

5. Shielding rings surrounding the top coil and the bottom coil can improve the performance of signal transmission.

6. Shielding rings surrounding the bottom coil and the top coil can protect the surrounding circuits and electronic devices from being influenced by electromagnetic wave created by the bottom coil and the top coil.

7. A transformer and coupler can be electrically connected to an external circuit and electronic devices.

It will be apparent to those skilled in the art that various modifications and variations can be made to the structure of the present invention without departing from the scope or spirit of the invention. Therefore, the protection area of the present invention depends on the claims attached in the patent application.

What is claimed is:

1. A method for fabricating a semiconductor chip, comprising:

providing a silicon substrate, multiple transistors in or on said silicon substrate, a first dielectric layer over said silicon substrate, a second dielectric layer over said first dielectric layer, a first metal layer in said second dielectric layer, a third dielectric layer over said second dielectric layer and said first metal layer, wherein said third dielectric layer comprises silicon, carbon and oxygen, and wherein said third dielectric layer comprises a material with a dielectric constant less than 3, a second metal layer in said third dielectric layer, a third metal layer over said third dielectric layer and said second metal layer, a fourth dielectric layer over said third dielectric layer and said second metal layer, wherein said fourth dielectric layer comprises a portion between said second and third metal layers, and a passivation layer over said first, second, third and fourth dielectric layers and said first, second and third metal layers, wherein said passivation layer comprises a nitride layer having a thickness between 0.2 and 1.2 micrometers, wherein said second metal layer comprises an electroplated copper layer and a first adhesion layer, wherein said first adhesion layer is at a sidewall and a bottom of said electroplated copper layer, wherein said electroplated copper layer has a top surface substantially coplanar with a top surface of said third dielectric layer;

forming a first polymer layer on said passivation layer, wherein said forming said first polymer layer comprises coating a first polymer film with a photosensitive material on said passivation layer, followed by exposing and developing said coated first polymer film, followed by curing said exposed and developed first polymer film to form said first polymer layer, wherein said first polymer layer has a thickness between 5 and 20 micrometers;

forming a second polymer layer over said first polymer layer, wherein said forming said second polymer layer comprises coating a second polymer film with a photosensitive material over said first polymer layer, followed by exposing and developing said coated second polymer film, followed by curing said exposed and developed second polymer film to form said second polymer layer, wherein said second polymer layer has a thickness between 5 and 20 micrometers, wherein there is no process step of forming a metal layer between said forming said first polymer layer and said forming said second polymer layer; and forming a fourth metal layer on said second polymer layer, wherein said forming said fourth metal layer comprises forming a second adhesion layer on said second polymer layer, followed by forming a seed layer on said second adhesion layer, followed by forming a photoresist layer on said seed layer, wherein an opening in said photoresist layer exposes a region of said seed layer, followed by electroplating a fifth metal layer over said region, followed by removing said photoresist layer, followed by removing said seed layer and said second adhesion layer not under said fifth metal layer such that said second adhesion layer is at a bottom of said fifth metal layer but not at a sidewall of said fifth metal layer.

2. The method of claim 1, wherein said forming said fourth metal layer comprises forming a coil on said second polymer layer.

3. The method of claim 1, after said forming said first polymer layer, further comprising forming a third polymer layer on said first polymer layer, followed by said forming said second polymer layer further on said third polymer layer, wherein said forming said third polymer layer comprises coating a third polymer film with a photosensitive material on said first polymer layer, followed by exposing and developing said coated third polymer film, followed by curing said exposed and developed third polymer film to form said third polymer layer, wherein said third polymer layer has a thickness between 5 and 20 micrometers.

4. The method of claim 1, wherein said electroplating said fifth metal layer comprises electroplating a gold layer having a thickness between 1 and 30 micrometers.

5. The method of claim 1, wherein said electroplating said fifth metal layer comprises electroplating a copper layer having a thickness between 1 and 30 micrometers.

6. The method of claim 1, wherein said forming said fourth metal layer, after said electroplating said fifth metal layer, further comprises electroplating a nickel layer on said fifth metal layer, followed by electroplating a gold layer on said nickel layer, followed by said removing said photoresist layer, wherein said electroplating said fifth metal layer comprises electroplating a copper layer on said region.

7. The method of claim 1, wherein said curing said exposed and developed first polymer film comprises said curing said exposed and developed first polymer film at a temperature between 250 and 450 centigrade degrees.

8. A method for fabricating a semiconductor chip, comprising:

providing a silicon substrate, multiple transistors in or on said silicon substrate, a first dielectric layer over said silicon substrate, a second dielectric layer over said first dielectric layer, a first metal layer in said second dielectric layer, a third dielectric layer over said second dielectric layer and said first metal layer, wherein said third dielectric layer comprises silicon, carbon and oxygen, and wherein said third dielectric layer comprises a material with a dielectric constant less than 3, a second metal layer in said third dielectric layer, a third metal layer over said third dielectric layer and said second metal layer, a fourth dielectric layer over said third dielectric layer and said second metal layer, wherein said fourth dielectric layer comprises a first portion between said second and third metal layers, and a passivation layer over said first, second, third and fourth dielectric layers and said first, second and third metal layers, wherein said passivation layer comprises a nitride layer having a thickness between 0.2 and 1.2 micrometers, wherein said second metal layer comprises a first adhesion layer and an electroplated copper layer, wherein said electroplated copper layer comprises a lower portion and an upper portion, and said lower and upper portions are integral, wherein said upper portion has a width greater than that of a bottom of said lower portion, wherein said upper portion has a top surface substantially coplanar with a top surface of said third dielectric layer, wherein said upper portion has a bottom surface with a first region and a second region, wherein said first and second regions are substantially coplanar at a horizontal level and separated by said electroplated copper layer, and said horizontal level is between said top surface of said third dielectric layer and a bottom surface of said third dielectric layer, wherein said first region is over a second portion of said third dielectric layer, and said second region is over a third portion of said third dielectric layer, wherein said lower portion is between said second and third portions of said third dielectric layer, wherein said first adhesion layer is at a sidewall of said lower portion, said bottom of said lower portion, said first and second regions and a sidewall of said upper portion, wherein said first adhesion layer at said bottom of said lower portion has a bottom surface substantially coplanar with said bottom surface of said third dielectric layer;
forming a first polymer layer on said passivation layer, wherein said forming said first polymer layer comprises coating a first polymer film with a photosensitive material on said passivation layer, followed by exposing and developing said coated first polymer film, followed by curing said exposed and developed first polymer film to form said first polymer layer, wherein said first polymer layer has a thickness between 5 and 20 micrometers;
forming a second polymer layer over said first polymer layer, wherein said forming said second polymer layer comprises coating a second polymer film with a photosensitive material over said first polymer layer, followed by exposing and developing said coated second polymer film, followed by curing said exposed and developed second polymer film to form said second polymer layer, wherein said second polymer layer has a thickness between 5 and 20 micrometers, wherein there is no process step of forming a metal layer between said forming said first polymer layer and said forming said second polymer layer; and
forming a fourth metal layer on said second polymer layer, wherein said forming said fourth metal layer comprises forming a second adhesion layer on said second polymer layer, followed by forming a seed layer on said second adhesion layer, followed by forming a photoresist layer on said seed layer, wherein an opening in said photoresist layer exposes a third region of said seed layer, followed by electroplating a fifth metal layer over said third region, followed by removing said photoresist layer, followed by removing said seed layer and said second adhesion layer not under said fifth metal layer such that, said second adhesion layer is at a bottom of said fifth metal layer but not at a sidewall of said fifth metal layer.

9. The method of claim 8, wherein said forming said fourth metal layer comprises forming a coil on said second polymer layer.

10. The method of claim 8, after said forming said first polymer layer, further comprising forming a third polymer layer on said first polymer layer, followed by said forming said second polymer layer further on said third polymer layer, wherein said forming said third polymer layer comprises coating a third polymer film with a photosensitive material on said first polymer layer, followed by exposing and developing said coated third polymer film, followed by curing said exposed and developed third polymer film to form said third polymer layer, wherein said third polymer layer has a thickness between 5 and 20 micrometers.

11. The method of claim 8, wherein said electroplating said fifth metal layer comprises electroplating a gold layer having a thickness between 1 and 30 micrometers.

12. The method of claim 8, wherein said electroplating said fifth metal layer comprises electroplating a copper layer having a thickness between 1 and 30 micrometers.

13. The method of claim 8, wherein said forming said fourth metal layer, after said electroplating said fifth metal layer, further comprises electroplating a nickel layer on said fifth metal layer, followed by electroplating a gold layer on said nickel layer, followed by said removing said photoresist layer, wherein said electroplating said fifth metal layer comprises electroplating a copper layer on said third region.

14. The method of claim 8, wherein said curing said exposed and developed first polymer film comprises said curing said exposed and developed first polymer film at a temperature between 250 and 450 centigrade degrees.

15. A method for fabricating a semiconductor chip, comprising:
providing a silicon substrate, multiple transistors in or on said silicon substrate, a first dielectric layer over said silicon substrate, a second dielectric layer over said first dielectric layer, a first metal layer in said second dielectric layer, a third dielectric layer over said second dielectric layer and said first metal layer, wherein said third dielectric layer comprises silicon, carbon and oxygen, and wherein said third dielectric layer comprises a material with a dielectric constant less than 3, a second metal layer in said third dielectric layer, a third metal layer over said third dielectric layer and said second metal layer, a fourth dielectric layer over said third dielectric layer and said second metal layer, wherein said fourth dielectric layer comprises a portion between said second and third metal layers, and a passivation layer over said first, second, third and fourth dielectric layers and said first, second and third metal layers, wherein said passivation layer comprises a nitride layer having a thickness between 0.2 and 1.2 micrometers, wherein an upper opening and a lower opening are in said third dielectric layer, and said upper opening is over and aligned with said lower opening, wherein said upper opening has a first sidewall and a second sidewall opposite to said first sidewall of said upper opening, wherein a width between said first and second sidewalls of said upper opening is greater than that of a bottom of said lower opening, wherein said second metal layer comprises a first adhesion layer on said bottom of said lower opening, a sidewall of said lower opening and said first and second sidewalls of said upper opening and an electroplated copper layer over said first adhesion layer, wherein said electroplated copper layer comprises a lower portion in said lower opening and an upper portion in said upper opening, wherein said lower and upper portions are integral, wherein said upper portion is over and aligned with said lower portion, wherein said upper portion has a top surface substantially coplanar with a top surface of said third dielectric layer, wherein said first adhesion layer is at a sidewall and a bottom of said lower portion and at a sidewall of said upper portion;

forming a first polymer layer on said passivation layer, wherein said forming said first polymer layer comprises coating a first polymer film with a photosensitive material on said passivation layer, followed by exposing and developing said coated first polymer film, followed by curing said exposed and developed first polymer film to form said first polymer layer, wherein said first polymer layer has a thickness between 5 and 20 micrometers;

forming a second polymer layer over said first polymer layer, wherein said forming said second polymer layer comprises coating a second polymer film with a photosensitive material over said first polymer layer, followed by exposing and developing said coated second polymer film, followed by curing said exposed and developed second polymer film to form said second polymer layer, wherein said second polymer layer has a thickness between 5 and 20 micrometers, wherein there is no process step of forming a metal layer between said forming said first polymer layer and said forming said second polymer layer; and forming a fourth metal layer on said second polymer layer, wherein said forming said fourth metal layer comprises forming a second adhesion layer on said second polymer layer, followed by forming a seed layer on said second adhesion layer, followed by forming a photoresist layer on said seed layer, wherein an opening in said photoresist layer exposes a region of said seed layer, followed by electroplating a fifth metal layer over said region, followed by removing said photoresist layer, followed by removing said seed layer and said second adhesion layer not under said fifth metal layer such that, said second adhesion layer is at a bottom of said fifth metal layer but not at a sidewall of said fifth metal layer.

16. The method of claim 15, wherein said forming said fourth metal layer comprises forming a coil on said second polymer layer.

17. The method of claim 15, wherein said electroplating said fifth metal layer comprises electroplating a gold layer having a thickness between 1 and 30 micrometers.

18. The method of claim 15, wherein said electroplating said fifth metal layer comprises electroplating a copper layer having a thickness between 1 and 30 micrometers.

19. The method of claim 15, wherein said forming said fourth metal layer, after said electroplating said fifth metal layer, further comprises electroplating a nickel layer on said fifth metal layer, followed by electroplating a gold layer on said nickel layer, followed by said removing said photoresist layer, wherein said electroplating said fifth metal layer comprises electroplating a copper layer on said region.

20. The method of claim 15, wherein said curing said exposed and developed first polymer film comprises said curing said exposed and developed first polymer film at a temperature between 250 and 450 centigrade degrees.

21. A method for fabricating a semiconductor chip, comprising:

providing a silicon substrate, multiple transistors in or on said silicon substrate, a first dielectric layer over said silicon substrate, a first metal layer over said silicon substrate and said first dielectric layer, a second metal layer over said first metal layer, a second dielectric layer between said first and second metal layers, wherein said second metal layer is connected to said first metal layer through an opening in said second dielectric layer, and a passivation layer over said first and second dielectric layers and said first and second metal layers, wherein said passivation layer comprises a nitride;

forming a metallization structure over said passivation layer, wherein said metallization structure comprises a metal trace and a metal bump directly on a top surface of said metal trace, wherein said metal bump comprises a first electroplated copper layer; and after said forming said metallization structure, forming a polymer layer over said passivation layer and said top surface of said metal trace whereby said polymer layer has no portion between said top surface of said metal trace and said metal bump, said metal bump has a top surface at a first horizontal level higher than a second horizontal level of a top surface of said polymer layer, said metal bump has a portion at a same horizontal level as said polymer layer, and said metal bump is spaced apart from said polymer layer.

22. The method of claim 21, wherein said polymer layer has a thickness between 5 and 20 micrometers.

23. The method of claim 21, wherein said metal trace comprises an adhesion layer, a copper-containing seed layer on said adhesion layer, and a second electroplated copper layer on said copper-containing seed layer, wherein said second electroplated copper layer has a thickness between 1 and 30 micrometers.

24. The method of claim 23, wherein said first electroplated copper layer is directly on said second electroplated copper layer.

25. The method of claim 21, wherein said first metal layer comprises electroplated copper.

26. The method of claim 21, wherein said first metal layer comprises aluminum.

27. The method of claim 21, wherein said metal bump has a thickness between 1 and 500 micrometers.

28. The method of claim 21, wherein said forming said polymer layer comprises an exposing process and a developing process.

29. The method of claim 21, wherein said forming said polymer layer comprises a coating process.

* * * * *